(12) United States Patent
Park et al.

(10) Patent No.: US 11,699,468 B2
(45) Date of Patent: Jul. 11, 2023

(54) MEMORY DEVICE, SEMICONDUCTOR SYSTEM, AND DATA PROCESSING SYSTEM

(71) Applicant: SK hynix Inc., Gyeonggi-do (KR)

(72) Inventors: Yong Sang Park, Gyeonggi-do (KR); Joo Young Kim, Gyeonggi-do (KR); Min Soo Lim, Gyeonggi-do (KR); Min Su Park, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 42 days.

(21) Appl. No.: 17/527,719

(22) Filed: Nov. 16, 2021

(65) Prior Publication Data

US 2022/0383916 A1 Dec. 1, 2022

(30) Foreign Application Priority Data

Jun. 1, 2021 (KR) .......................... 10-2021-0071108

(51) Int. Cl.
*G11C 7/10* (2006.01)
*G11C 8/06* (2006.01)

(52) U.S. Cl.
CPC ............ *G11C 7/1069* (2013.01); *G11C 7/109* (2013.01); *G11C 7/1063* (2013.01); *G11C 7/1096* (2013.01); *G11C 8/06* (2013.01)

(58) Field of Classification Search
CPC ...... G11C 7/1069; G11C 7/1063; G11C 7/109; G11C 7/1096; G11C 8/06
See application file for complete search history.

(56) References Cited

U.S. PATENT DOCUMENTS

| 5,131,083 A | * | 7/1992 | Crawford | ............ G06F 12/0879 |
| | | | | 710/29 |
| 6,081,853 A | * | 6/2000 | Gaskins | .............. G06F 12/1045 |
| | | | | 711/217 |

FOREIGN PATENT DOCUMENTS

| KR | 10-2011-0079495 A | 7/2011 |
| KR | 10-2013-0081388 A | 7/2013 |

* cited by examiner

*Primary Examiner* — Son L Mai
(74) *Attorney, Agent, or Firm* — IP & T Group LLP

(57) ABSTRACT

A memory device includes a memory cell array and a peripheral circuit. The memory cell array includes a plurality of memory regions each identified by a row address and a column address. The peripheral circuit accesses the memory cell array by performing, based on an address, a burst length and a burst address gap provided from a memory controller, a burst operation supporting a variable burst address gap. The burst address gap is a numerical difference between adjacent column addresses, on which the burst operation is to be performed.

32 Claims, 26 Drawing Sheets

FIG. 2A

BL=4
BAG=1

| RAD1 | CAD1 | CAD2 | CAD3 | CAD4 | CAD5 | CAD6 | CAD7 | CAD8 | CAD9 | CAD10 | CAD11 | CAD12 | CAD13 | CAD14 | CAD15 | CAD16 |
|---|---|---|---|---|---|---|---|---|---|---|---|---|---|---|---|---|
| | DQ1 | DQ2 | DQ3 | DQ4 | | | | | | | | | | | | |
| | M1 | M2 | M3 | M4 | M5 | M6 | M7 | M8 | M9 | M10 | M11 | M12 | M13 | M14 | M15 | M16 |

FIG. 2B

BL=4
BAG=4

| RAD1 | CAD1 | CAD2 | CAD3 | CAD4 | CAD5 | CAD6 | CAD7 | CAD8 | CAD9 | CAD10 | CAD11 | CAD12 | CAD13 | CAD14 | CAD15 | CAD16 |
|---|---|---|---|---|---|---|---|---|---|---|---|---|---|---|---|---|
| | DQ1 | | | | DQ2 | | | | DQ3 | | | | DQ4 | | | |
| | M1 | M2 | M3 | M4 | M5 | M6 | M7 | M8 | M9 | M10 | M11 | M12 | M13 | M14 | M15 | M16 |

FIG. 4

| | CAD1 | CAD2 | CAD3 | CAD4 | CAD5 | CAD6 | CAD7 | CAD8 | CAD9 | CAD10 | CAD11 | CAD12 | CAD13 | CAD14 | CAD15 | CAD16 |
|---|---|---|---|---|---|---|---|---|---|---|---|---|---|---|---|---|
| RAD1 | 1\|1 | 1\|2 | 1\|3 | 1\|4 | 1\|5 | 1\|6 | 1\|7 | 1\|8 | 1\|9 | 1\|10 | 1\|11 | 1\|12 | 1\|13 | 1\|14 | 1\|15 | 1\|16 |
| RAD2 | 2\|1 | 2\|2 | 2\|3 | 2\|4 | 2\|5 | 2\|6 | 2\|7 | 2\|8 | 2\|9 | 2\|10 | 2\|11 | 2\|12 | 2\|13 | 2\|14 | 2\|15 | 2\|16 |
| RAD3 | 3\|1 | 3\|2 | 3\|3 | 3\|4 | 3\|5 | 3\|6 | 3\|7 | 3\|8 | 3\|9 | 3\|10 | 3\|11 | 3\|12 | 3\|13 | 3\|14 | 3\|15 | 3\|16 |
| RAD4 | 4\|1 | 4\|2 | 4\|3 | 4\|4 | 4\|5 | 4\|6 | 4\|7 | 4\|8 | 4\|9 | 4\|10 | 4\|11 | 4\|12 | 4\|13 | 4\|14 | 4\|15 | 4\|16 |
| RAD5 | 5\|1 | 5\|2 | 5\|3 | 5\|4 | 5\|5 | 5\|6 | 5\|7 | 5\|8 | 5\|9 | 5\|10 | 5\|11 | 5\|12 | 5\|13 | 5\|14 | 5\|15 | 5\|16 |
| RAD6 | 6\|1 | 6\|2 | 6\|3 | 6\|4 | 6\|5 | 6\|6 | 6\|7 | 6\|8 | 6\|9 | 6\|10 | 6\|11 | 6\|12 | 6\|13 | 6\|14 | 6\|15 | 6\|16 |
| RAD7 | 7\|1 | 7\|2 | 7\|3 | 7\|4 | 7\|5 | 7\|6 | 7\|7 | 7\|8 | 7\|9 | 7\|10 | 7\|11 | 7\|12 | 7\|13 | 7\|14 | 7\|15 | 7\|16 |
| RAD8 | 8\|1 | 8\|2 | 8\|3 | 8\|4 | 8\|5 | 8\|6 | 8\|7 | 8\|8 | 8\|9 | 8\|10 | 8\|11 | 8\|12 | 8\|13 | 8\|14 | 8\|15 | 8\|16 |
| RAD9 | 9\|1 | 9\|2 | 9\|3 | 9\|4 | 9\|5 | 9\|6 | 9\|7 | 9\|8 | 9\|9 | 9\|10 | 9\|11 | 9\|12 | 9\|13 | 9\|14 | 9\|15 | 9\|16 |
| RAD10 | 10\|1 | 10\|2 | 10\|3 | 10\|4 | 10\|5 | 10\|6 | 10\|7 | 10\|8 | 10\|9 | 10\|10 | 10\|11 | 10\|12 | 10\|13 | 10\|14 | 10\|15 | 10\|16 |
| RAD11 | 11\|1 | 11\|2 | 11\|3 | 11\|4 | 11\|5 | 11\|6 | 11\|7 | 11\|8 | 11\|9 | 11\|10 | 11\|11 | 11\|12 | 11\|13 | 11\|14 | 11\|15 | 11\|16 |
| RAD12 | 12\|1 | 12\|2 | 12\|3 | 12\|4 | 12\|5 | 12\|6 | 12\|7 | 12\|8 | 12\|9 | 12\|10 | 12\|11 | 12\|12 | 12\|13 | 12\|14 | 12\|15 | 12\|16 |
| RAD13 | 13\|1 | 13\|2 | 13\|3 | 13\|4 | 13\|5 | 13\|6 | 13\|7 | 13\|8 | 13\|9 | 13\|10 | 13\|11 | 13\|12 | 13\|13 | 13\|14 | 13\|15 | 13\|16 |
| RAD14 | 14\|1 | 14\|2 | 14\|3 | 14\|4 | 14\|5 | 14\|6 | 14\|7 | 14\|8 | 14\|9 | 14\|10 | 14\|11 | 14\|12 | 14\|13 | 14\|14 | 14\|15 | 14\|16 |
| RAD15 | 15\|1 | 15\|2 | 15\|3 | 15\|4 | 15\|5 | 15\|6 | 15\|7 | 15\|8 | 15\|9 | 15\|10 | 15\|11 | 15\|12 | 15\|13 | 15\|14 | 15\|15 | 15\|16 |
| RAD16 | 16\|1 | 16\|2 | 16\|3 | 16\|4 | 16\|5 | 16\|6 | 16\|7 | 16\|8 | 16\|9 | 16\|10 | 16\|11 | 16\|12 | 16\|13 | 16\|14 | 16\|15 | 16\|16 |

120

BL=4

BR4 RAD1, CAD13 | 1\|13 | 1\|14 | 1\|15 | 1\|16 |
BR3 RAD1, CAD9 | 1\|9 | 1\|10 | 1\|11 | 1\|12 |
BR2 RAD1, CAD5 | 1\|5 | 1\|6 | 1\|7 | 1\|8 |
BR1 RAD1, CAD1 | 1\|1 | 1\|2 | 1\|3 | 1\|4 |

OBTAIN 1ST ROW

| | CAD1 | CAD2 | CAD3 | CAD4 | CAD5 | CAD6 | CAD7 | CAD8 | CAD9 | CAD10 | CAD11 | CAD12 | CAD13 | CAD14 | CAD15 | CAD16 |
|---|---|---|---|---|---|---|---|---|---|---|---|---|---|---|---|---|
| RAD1 | 1 1 | 1 2 | 1 3 | 1 4 | 1 1 | 2 2 | 2 3 | 2 4 | 2 1 | 3 2 | 3 3 | 3 4 | 3 1 | 4 2 | 4 3 | 4 4 |
| RAD2 | 1 5 | 1 5 | 1 7 | 1 8 | 2 5 | 2 6 | 2 7 | 2 8 | 6 1 | 6 2 | 7 3 | 7 4 | 7 1 | 8 2 | 8 3 | 8 4 |
| RAD3 | 1 9 | 1 10 | 1 11 | 1 12 | 2 9 | 2 10 | 2 11 | 2 12 | 10 1 | 11 2 | 11 3 | 11 4 | 11 1 | 12 2 | 12 3 | 12 4 |
| RAD4 | 1 13 | 1 14 | 1 15 | 1 16 | 2 13 | 2 14 | 2 15 | 2 16 | 14 1 | 15 2 | 15 3 | 15 4 | 15 1 | 16 2 | 16 3 | 16 4 |
| RAD5 | 5 1 | 1 6 | 1 7 | 1 8 | 1 5 | 2 6 | 2 7 | 2 8 | 2 5 | 3 6 | 3 7 | 3 8 | 3 5 | 4 6 | 4 7 | 4 8 |
| RAD6 | 5 5 | 5 6 | 5 7 | 5 8 | 5 5 | 6 6 | 6 7 | 6 8 | 6 5 | 7 6 | 7 7 | 7 8 | 7 5 | 8 6 | 8 7 | 8 8 |
| RAD7 | 5 9 | 5 10 | 5 11 | 5 12 | 6 9 | 6 10 | 6 11 | 6 12 | 10 5 | 11 6 | 11 7 | 11 8 | 11 5 | 12 6 | 12 7 | 12 8 |
| RAD8 | 5 13 | 5 14 | 5 15 | 5 16 | 6 13 | 6 14 | 6 15 | 6 16 | 14 5 | 15 6 | 15 7 | 15 8 | 15 5 | 16 6 | 16 7 | 16 8 |
| RAD9 | 9 1 | 1 10 | 1 11 | 1 12 | 1 9 | 2 10 | 2 11 | 2 12 | 2 9 | 3 10 | 3 11 | 3 12 | 3 9 | 4 10 | 4 11 | 4 12 |
| RAD10 | 9 5 | 5 10 | 5 11 | 5 12 | 6 9 | 6 10 | 6 11 | 6 12 | 6 9 | 7 10 | 7 11 | 7 12 | 7 9 | 8 10 | 8 11 | 8 12 |
| RAD11 | 9 9 | 9 10 | 9 11 | 9 12 | 9 9 | 10 10 | 10 11 | 10 12 | 10 9 | 11 10 | 11 11 | 11 12 | 11 9 | 12 10 | 12 11 | 12 12 |
| RAD12 | 9 13 | 9 14 | 9 15 | 9 16 | 10 13 | 10 14 | 10 15 | 10 16 | 14 9 | 15 10 | 15 11 | 15 12 | 15 9 | 16 10 | 16 11 | 16 12 |
| RAD13 | 13 1 | 1 14 | 1 15 | 1 16 | 1 13 | 2 14 | 2 15 | 2 16 | 2 13 | 3 14 | 3 15 | 3 16 | 3 13 | 4 14 | 4 15 | 4 16 |
| RAD14 | 13 5 | 5 14 | 5 15 | 5 16 | 6 13 | 6 14 | 6 15 | 6 16 | 6 13 | 7 14 | 7 15 | 7 16 | 7 13 | 8 14 | 8 15 | 8 16 |
| RAD15 | 13 9 | 9 14 | 9 15 | 9 16 | 10 13 | 10 14 | 10 15 | 10 16 | 10 13 | 11 14 | 11 15 | 11 16 | 11 13 | 12 14 | 12 15 | 12 16 |
| RAD16 | 13 13 | 13 14 | 13 15 | 13 16 | 13 13 | 14 14 | 14 15 | 14 16 | 14 13 | 15 14 | 15 15 | 15 16 | 15 13 | 16 14 | 16 15 | 16 16 |

BL=4
BAG=4

| BR4 | RAD4, CAD1 | 1 | 13 | 1 | 14 | 1 | 15 | 1 | 16 |
| BR3 | RAD3, CAD1 | 1 | 9 | 1 | 10 | 1 | 11 | 1 | 12 |
| BR2 | RAD2, CAD1 | 1 | 5 | 1 | 6 | 1 | 7 | 1 | 8 |
| BR1 | RAD1, CAD1 | 1 | 1 | 1 | 2 | 1 | 3 | 1 | 4 |

OBTAIN 1ST ROW

MEMORY DEVICE, SEMICONDUCTOR SYSTEM, AND DATA PROCESSING SYSTEM

CROSS-REFERENCES TO RELATED APPLICATION

The present application claims priority under 35 U.S.C. § 119(a) to Korean patent application number 10-2021-0071108, filed on Jun. 1, 2021, which is incorporated herein by reference in its entirety as set forth in full.

BACKGROUND

1. Technical Field

Various embodiments of the present disclosure are related to an integrated circuit technology, and more particularly, to a memory device, a semiconductor system and a data processing system using the same.

2. Related Art

An electronic device may include many electronic elements. Moreover, a computer system as the electronic device includes many electronic elements each configured by a semiconductor. Among semiconductor devices configuring the computer system, a host such as a processor or a memory controller may perform data communication with a memory device. The memory device includes a plurality of memory cells, each of which is identified by a word line and a bit line. The memory device is configured to store data therein. The data to be stored in the memory device includes a matrix. During an artificial intelligence (AI) training operation, the matrix may be read, as an original matrix or a transposed matrix, from the memory device to be utilized.

SUMMARY

In an embodiment of the present disclosure, a memory device may include a memory cell array and a peripheral circuit. The memory cell array may include a plurality of memory regions each identified by a corresponding row address and a corresponding column address. The peripheral circuit may access the memory cell array by performing, based on an address, a burst length and a burst address gap provided from a memory controller, a burst operation supporting a variable burst address gap. The burst address gap is a numerical difference between adjacent column addresses, on which the burst operation is to be performed.

In an embodiment, a semiconductor system may include a memory device and a memory controller. The memory device may include a memory cell array and a peripheral circuit. The memory cell array may include a plurality of memory regions. The peripheral circuit may access the memory cell array by performing a burst operation supporting a variable burst address gap. The memory controller may provide the memory device with an address, a burst length and a burst address gap in order to control the burst operation. The the burst address gap is a numerical difference between adjacent column addresses, on which the burst operation is to be performed.

In an embodiment of the present disclosure, a semiconductor system may include a plurality of memory devices and a memory controller. The memory controller may be coupled to the plurality of memory devices respectively through a plurality of device line groups and may be coupled to a host device through system lines. The memory controller may include a write data processing component. The write data processing component may receive from the host device, base device information indicating a base device among the plurality of memory devices, a map based on the base device information, the plurality of device line groups and a plurality of system line groups, which are divided from the system lines, and transfer data which are provided from the host device through the plurality of system line groups, to the plurality of device line groups mapped to the plurality of system line groups, respectively.

In an embodiment of the present disclosure, a data processing system may include a semiconductor system and a host device. The semiconductor system may include a plurality of memory devices and a memory controller. The memory controller may be coupled to the plurality of memory devices respectively through a plurality of device line groups. The host device may be coupled to the memory controller through system lines and may provide the memory controller with base device information indicating a base device among the plurality of memory devices. The host device may transmit, in order to store a matrix into the semiconductor system, a plurality of elements of the matrix to a plurality of system line groups, which are divided from the system lines, in a parallel way. The memory controller may map, based on the base device information, the plurality of system line groups to the plurality of device line groups to store the matrix into the plurality of memory devices. A precision degree of the matrix may be the same as a bit width of each of the plurality of device line groups.

In an embodiment of the present disclosure, an operating method of a data processing system including a host and a memory system may include performing, by a host, a first number of repetitions of firstly providing the memory system with a first row address, a first start column address and a second number of elements belonging to a row of a matrix; and performing, by the memory system in response to the firstly providing, a write operation of storing the provided elements sequentially and respectively into memory regions indicated by the first row address and a second number of column addresses, which start from the first start column address and have a numerical difference of the second number between adjacent ones. The first number may be obtained by dividing a number of elements configuring the row by the second number. The firstly providing may include changing, at the respective repetitions, the first row address to a row address increasing consecutively from a row address of a memory region, to which an initial element of the row is to be stored. The first start column address may be a column address of a memory region, to which the initial element of the row is to be stored.

In an embodiment of the present disclosure, the operating method of a data processing system may further include performing, by a host, the first number of repetitions of secondly providing the memory system with the first row address and the first start column address; and performing, by the memory system in response to the secondly providing, a read operation of reading out the second number of elements, which belong to the row, sequentially and respectively from the memory regions indicated by the first row address and the second number of column addresses. The secondly providing may include changing, at the respective repetitions, the first row address to the consecutively increasing row address.

In an embodiment of the present disclosure, the operating method of a data processing system may further include performing, by a host, a third number of repetitions of secondly providing the memory system with a second row address and a second start column address; and performing, by the memory system in response to the secondly providing, a read operation of reading out the second number of elements, which belong to a column of the matrix, sequentially and respectively from memory regions indicated by the second row address and the second number of consecutive column addresses starting from the second start column address. The third number may be obtained by dividing a number of elements configuring the column by the second number. The secondly providing may include changing, at the respective repetitions, the second row address to a row address increasing by a multiple of the second number from a row address of a memory region, in which an initial element of the column is stored. The second start column address may be a column address of a memory region, in which the initial element of the column is stored.

BRIEF DESCRIPTION OF THE DRAWINGS

FIGS. 2A and 2B are diagrams illustrating a process in which the memory device of FIG. 1 performs the burst operation supporting the burst address gap according to an embodiment of the present disclosure.

FIG. 4 is a diagram illustrating a process of obtaining an original matrix from the memory device through a burst read operation when a matrix is stored in the memory device according to a row major scheme according to an embodiment of the present disclosure.

FIG. 6 is a diagram illustrating a process of storing a 16×16 matrix into the memory device supporting the variable burst address gap according to an embodiment of the present disclosure.

FIG. 7 is a diagram illustrating a process of obtaining an original matrix from the memory device through a burst read operation according to an embodiment of the present disclosure.

DETAILED DESCRIPTION

Various embodiments of the present disclosure will be described below in more detail with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

The drawings are not necessarily to scale and, in some instances, proportions may have been exaggerated in order to clearly illustrate features of the embodiments. The terminology used herein is for the purpose of describing particular embodiments only and is not intended to be limiting of the disclosure.

As used herein, the term "and/or" includes at least one of the associated listed items. It will be understood that when an element is referred to as being "connected to", or "coupled to" another element, it may be directly on, connected to, or coupled to the other element, or one or more intervening elements may be present. As used herein, singular forms are intended to include the plural forms and vice versa, unless the context clearly indicates otherwise. It will be further understood that the terms "comprises," "comprising," "includes," and "including" when used in this specification, specify the presence of the stated elements and do not preclude the presence or addition of one or more other elements.

Hereinafter, embodiments of the present disclosure will be described below with reference to the accompanying drawings.

According to an embodiment, provided may be a memory device, a semiconductor system and a data processing system capable of efficiently storing a matrix therein and capable of reading an original matrix or a transposed matrix at a low cost in order to utilize the read matrix.

Figure 1:
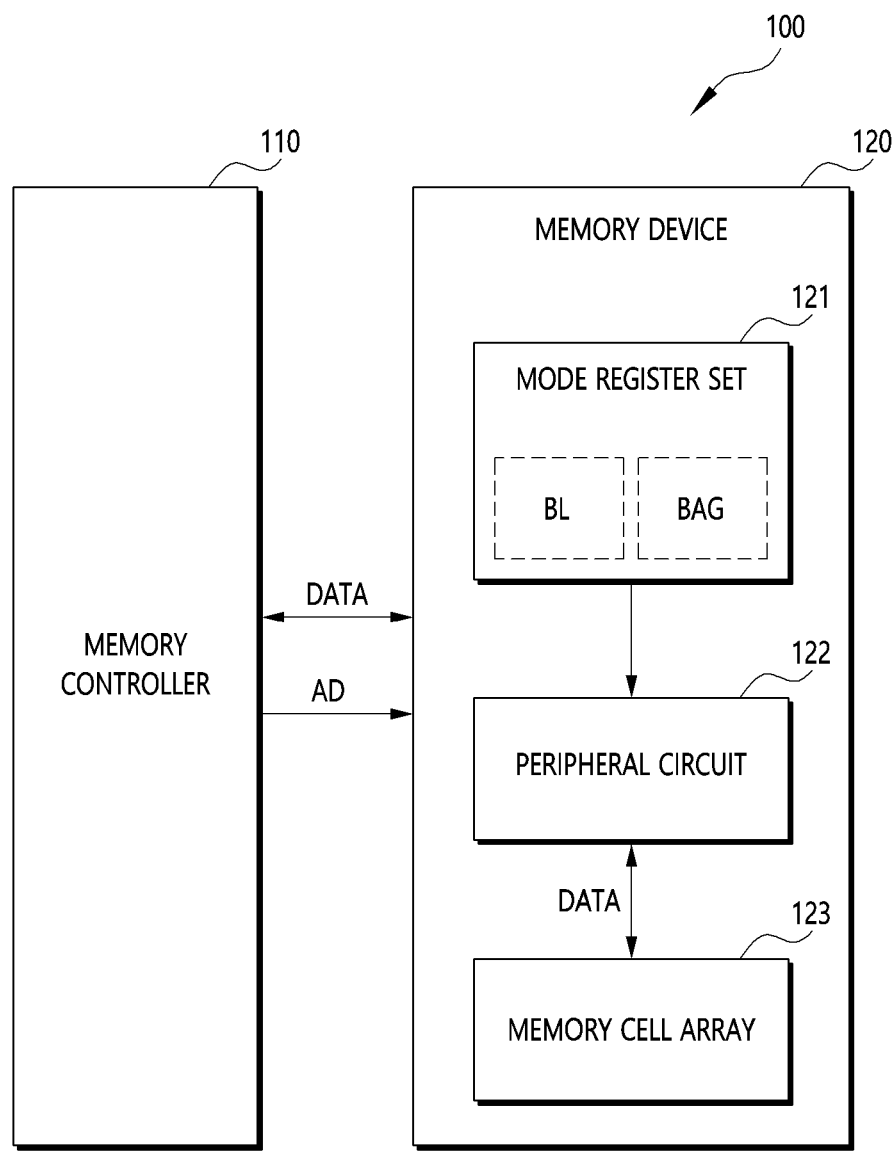
FIG. 1 is a block diagram illustrating a semiconductor system including a memory device supporting a variable burst address gap (BAG) according to an embodiment of the present disclosure.

FIG. 1 is a block diagram illustrating a semiconductor system 100 including a memory device 120 supporting a variable burst address gap (BAG) according to an embodiment of the present disclosure.

Referring to FIG. 1, the semiconductor system 100 may include a memory controller 110 and the memory device 120.

The memory controller 110 may provide various control signals required for an operation of the memory device 120. The memory controller 110 may be embedded in a host device of various types. The host device may include a central processing unit (CPU), a graphic processing unit (GPU), a multi-media processor (MMP), a digital signal processor, an application processor (AP) and so forth. In an embodiment, the memory controller 110 may be stacked together with the memory device 120 on a single substrate to be packaged into a single package. The memory device 120 may include a dynamic random access memory (DRAM).

The memory controller 110 may control the memory device 120 to store data DATA therein and read data DATA therefrom. The memory controller 110 may provide the memory device 120 with an address AD for a write or read operation.

The memory device 120 may include a mode register set 121, a peripheral circuit 122 and a memory cell array 123.

The mode register set 121 may store parameter values for an operation of the memory device 120. For example, the mode register set 121 may store a burst length BL and a burst address gap BAG, which are set by the memory controller 110.

The peripheral circuit 122 may access, when the memory controller 110 commands a burst operation, the memory cell array 123 by performing the burst operation, which supports the variable burst address gap, based on the address AD provided from the memory controller 110 and the burst length BL and the burst address gap BAG stored in the mode register set 121. The peripheral circuit 122 may access the memory cell array 123 to store into the memory cell array 123, the data DATA provided from the memory controller 110 and to provide the memory controller 110 with the data DATA read from the memory cell array 123.

The memory cell array 123 may include a plurality of memory cells configured to store the data DATA. Under the control of the peripheral circuit 122, the memory cell array 123 may store therein the data DATA provided from the memory controller 110 and may provide the peripheral circuit 122 with the data DATA stored therein.

In this disclosure, a data set DQ may be a group or a unit of the data DATA, which is input to the memory device 120 at a time or output from the memory device 120 at a time through DQ pins coupled to the memory device 120. For example, each data set DQ may be configured by 8 bits when the memory device 120 is coupled to the memory controller 110 through 8 number of DQ pins.

In this disclosure, a burst write operation may be performed by the memory device 120 and may be an operation of consecutively receiving data sets DQs, a number of which corresponds to the burst length BL, and storing the sequence of data sets DQs into the memory cell array 123 in response to a single write command (e.g., a burst write command) provided from the memory controller 110. In this disclosure, a burst read operation may be performed by the memory device 120 and may be an operation of consecutively reading out data sets DQs, a number of which corresponds to the burst length BL, from the memory cell array 123 and providing the read sequence of data sets DQs to the memory controller 110 in response to a single read command (e.g., a burst read command) provided from the memory controller 110. The burst length BL may represent a number of data sets DQs to be written into or read from the memory cell array 123 through the burst write operation or the burst read operation of the memory device 120. The burst length BL may be selected by the memory controller 110.

In an embodiment, a burst operation may support a variable burst address gap BAG. The burst address gap BAG may represent a numerical difference between adjacent column addresses, on which the burst write operation or the burst read operation is performed. The burst address gap BAG may represent a numerical difference between adjacent column addresses, corresponding to a number of data sets DQs indicated by the burst length BL which are to be written into or read from memory regions. The column addresses as target addresses of the burst write/read operation may start from a start column address and may have a numerical difference from each other by an amount of the burst address gap BAG. A number of the column addresses as target addresses of the burst write/read operation may correspond to the burst length BL. The burst address gap BAG may be a positive number greater than one (1). The burst address gap BAG may be selected by the memory controller 110.

FIGS. 2A and 2B are diagrams illustrating a process that the memory device 120 of FIG. 1 performs the burst operation supporting the burst address gap BAG according to an embodiment of the present disclosure.

Referring to FIG. 2A, the memory cell array 123 of FIG. 1 may include memory regions M1 to M16 commonly corresponding to a first row address RAD1 and respectively corresponding to consecutive first to sixteenth column addresses CAD1 to CAD16. Each of the memory regions M1 to M16 may store a single data set DQ. The memory regions M1 to M16 may be included in the same page. In an embodiment, a number of consecutive column addresses corresponding to a page may be greater or less than sixteen (16).

The memory controller 110 may command, to the memory device 120, a burst write operation for the burst length BL of a value four (4) and the burst address gap BAG of a value one (1). The burst address gap BAG of a value one (1) may represent one (1) as the numerical difference between adjacent column addresses, on which the burst write operation is to be performed. For the burst write operation, the memory controller 110 may provide the memory device 120 with the first row address RAD1, a first column address CAD1 and data sets DQ1 to DQ4. The first column address CAD1 may be a start column address on which the burst write operation is to be performed. The first row address RAD1 and the first column address CAD1 may be provided as the address AD of FIG. 1, to the memory device 120.

Therefore, the memory device 120 may store the data sets DQ1 to DQ4 respectively into memory regions M1 to M4 corresponding to the first row address RAD1 and consecutive first to fourth column addresses CAD1 to CAD4. Since the burst address gap BAG is of a value one (1), the numerical difference may be one (1) between neighbouring ones of the column addresses CAD1 to CAD4 respectively corresponding to the memory regions M1 to M4 storing the respective data sets DQ1 to DQ4.

The burst operation supporting the burst address gap BAG of a value one (1) may store data in substantially the same way as a burst operation, which does not support the burst address gap BAG.

Referring to FIG. 2B, the memory controller 110 may command, to the memory device 120, a burst write operation for the burst length BL of a value four (4) and the burst address gap BAG of a value four (4). The burst address gap BAG of a value four (4) may represent four (4) as the numerical difference between adjacent column addresses, on which the burst write operation is to be performed. For the burst write operation, the memory controller 110 may provide the memory device 120 with the first row address RAD1, a first column address CAD1 and data sets DQ1 to DQ4. The first column address CAD1 may be a start column address, on which the burst write operation is to be performed.

Therefore, the memory device 120 may store the data sets DQ1 to DQ4 respectively into memory regions M1, M5, M9 and M13 corresponding to the first row address RAD1 and first, fifth, ninth and thirteenth column addresses CAD1, CAD5, CAD9 and CAD13. Since the burst address gap BAG is of a value four (4), the numerical difference may be four (4) between neighbouring ones of the first, fifth, ninth and thirteenth column addresses CAD1, CAD5, CAD9 and CAD13 respectively corresponding to the memory regions M1, M5, M9 and M13 storing the respective data sets DQ1 to DQ4.

The burst address gap BAG may be applied to a burst read operation in a similar way to the burst write operation. In order to read data sets DQ1 to DQ4 stored as illustrated in FIG. 2A, the memory controller 110 may command, to the memory device 120, a burst read operation for the burst length BL of a value four (4), the burst address gap BAG of a value one (1) and the first column address CAD1 as the start column address. In order to read data sets DQ1 to DQ4 stored as illustrated in FIG. 2B, the memory controller 110 may command, to the memory device 120, a burst read operation for the burst length BL of a value four (4), the burst address gap BAG of a value four (4) and the first column address CAD1 as the start column address.

Figure 3:
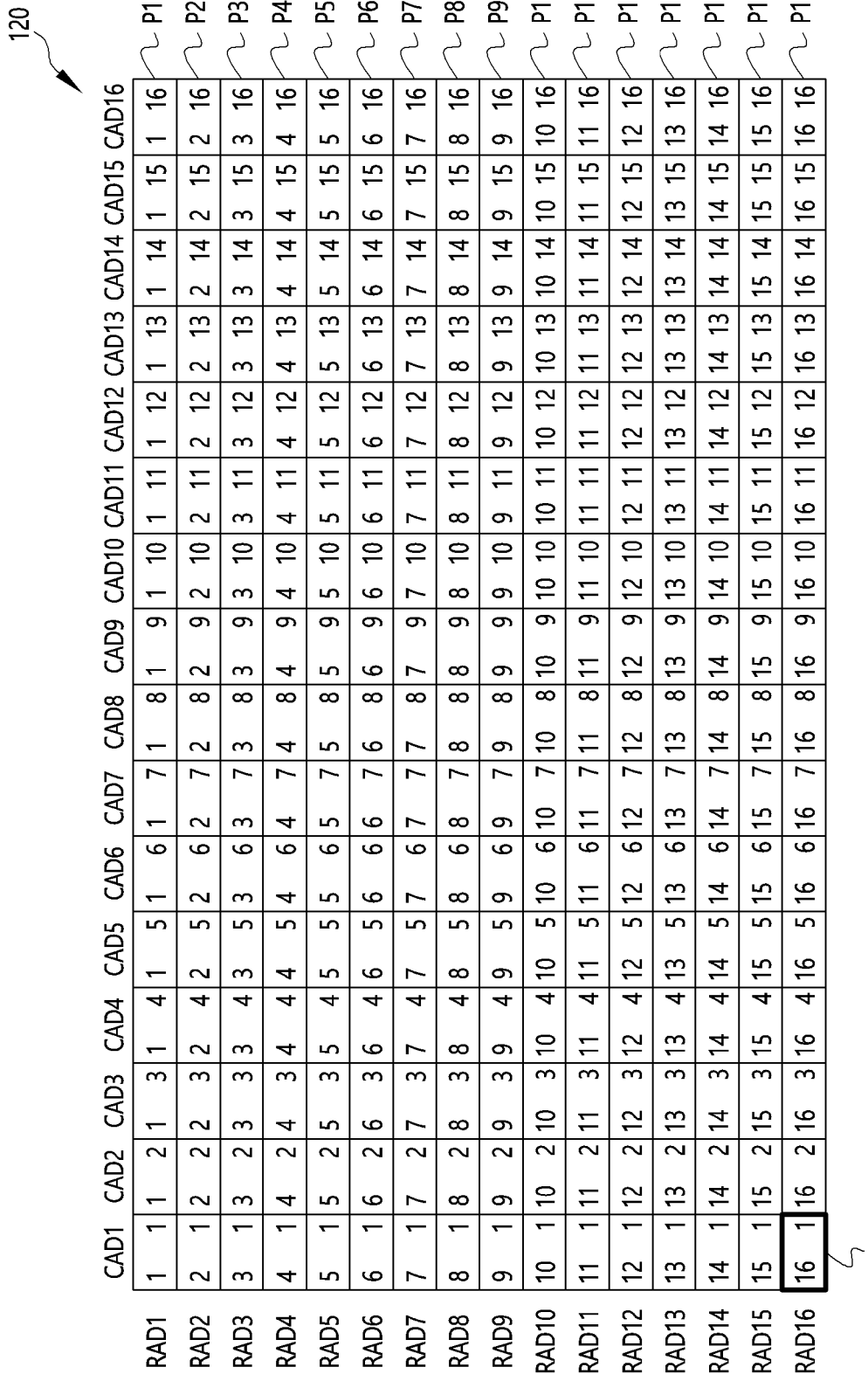
FIG. 3 is a diagram illustrating a process of storing a 16×16 matrix into the memory device according to an embodiment of the present disclosure.

FIG. 3 is a diagram illustrating a process of storing a 16×16 matrix into the memory device 120. In this disclosure, a N×N matrix may be a N×N array of data sets DQs. An element within the matrix may be a single data set DQ. N×N number of memory regions may be required to store the N×N matrix therein.

Referring to FIG. 3, the memory device 120 may include pages P1 to P16 respectively corresponding to consecutive first to sixteenth row addresses RAD1 to RAD16. Each of the pages P1 to P16 may include memory regions respectively corresponding to consecutive column addresses CAD1 to CAD16. Each of the memory regions included in the memory device 120 may be identified by a single row address and a single column address. Each of the memory regions may store each element of a matrix. Each element within a matrix may be represented by a row number and a column number of the matrix. As illustrated in FIG. 3, between two numerals marked within an element EM, sixteen (16) on the left may indicate the sixteenth row RAD16 corresponding to the element EM within the matrix and one (1) on the right may indicate the first column CAD1 corresponding to the element EM within the matrix.

A number of bits or a bit width configuring each element of a matrix, that is, a bit-size of the data set DQ may represent a precision degree of the matrix. When the precision degree of a matrix is the same as a number of data pins or a device input/output bit width of the memory device 120, elements of the matrix may be stored in respective memory regions.

As illustrated in FIG. 3, the matrix may be stored in the memory device 120 according to a row major scheme. That is, rows of the matrix may be stored in respective pages. For example, a first row of the matrix may be stored in the first page P1 corresponding to the first row address RAD1, a second row of the matrix may be stored in the second page P2 corresponding to the second row address RAD2 and a sixteenth row of the matrix may be stored in the sixteenth page P16 corresponding to the sixteenth row address RAD16.

Differently from the illustration of FIG. 3, the matrix may be stored in the memory device 120 according to a column major scheme. Columns of the matrix may be stored in respective pages. For example, a first column of the matrix may be stored in the first page P1 corresponding to the first row address RAD1, a second column of the matrix may be stored in the second page P2 corresponding to the second row address RAD2 and a sixteenth column of the matrix may be stored in the sixteenth page P16 corresponding to the sixteenth row address RAD16. That is, in view of the array of the memory regions illustrated in FIG. 3, the matrix may be stored as an original matrix according to the row major scheme and the matrix may be stored as a transposed matrix according to the column major scheme.

During a data processing operation such as a deep learning training operation of an artificial intelligence (AI) system, both original and transposed matrixes of a matrix may be utilized. However, due to the limited storage capacity of the memory device 120, it may be difficult to store both the original and transposed matrixes into the memory device 120. Therefore, for example, the matrix may be stored as the original matrix into the memory device 120 according to the row major scheme, and the original and transposed matrixes of the matrix may be obtained through processes which will be described with reference to FIGS. 4 and 5.

FIG. 4 is a diagram illustrating a process of obtaining an original matrix from the memory device 120 through a burst read operation when a matrix is stored in the memory device 120 according to a row major scheme according to an embodiment of the present disclosure. In the embodiment of FIG. 4, the memory device 120 does not utilize the burst address gap BAG.

Referring to FIG. 4, the matrix may be stored in the memory device 120 according to the row major scheme, as described with reference to FIG. 3. The memory controller 110 may obtain the first row of the matrix through first to fourth burst read operations BR1 to BR4 for the burst length BL of a value four (4).

Specifically, the memory controller 110 may provide the memory device 120 with a first row address RAD1 and a first column address CAD1 for the first burst read operation BR1. The memory device 120 may perform the first burst read operation BR1 with the first column address CAD1 as a start column address. As a result, the memory controller 110 may obtain elements of the first row and the first to fourth columns from the matrix.

The memory controller 110 may provide the memory device 120 with the first row address RAD1 and a fifth column address CAD5 for the second burst read operation BR2. The memory device 120 may perform the second burst read operation BR2 with the fifth column address CAD5 as a start column address. As a result, the memory controller 110 may obtain elements of the first row and the fifth to eighth columns from the matrix.

The memory controller 110 may provide the memory device 120 with the first row address RAD1 and a ninth column address CAD9 for the third burst read operation BR3. The memory device 120 may perform the third burst read operation BR3 with the ninth column address CAD9 as a start column address. As a result, the memory controller 110 may obtain elements of the first row and the ninth to twelfth columns from the matrix.

The memory controller 110 may provide the memory device 120 with the first row address RAD1 and a thirteenth column address CAD13 for the fourth burst read operation BR4. The memory device 120 may perform the fourth burst read operation BR4 with the thirteenth column address CAD13 as a start column address. As a result, the memory controller 110 may obtain elements of the first row and the thirteenth to sixteenth columns from the matrix.

The second to sixteenth rows may be obtained from the matrix in the similar way to the first row described above. That is, the first to sixteenth rows may be sequentially obtained through the sequential burst read operations with the first to sixteenth row addresses. Therefore, the original matrix may be obtained in the relatively easy way.

Figure 5:
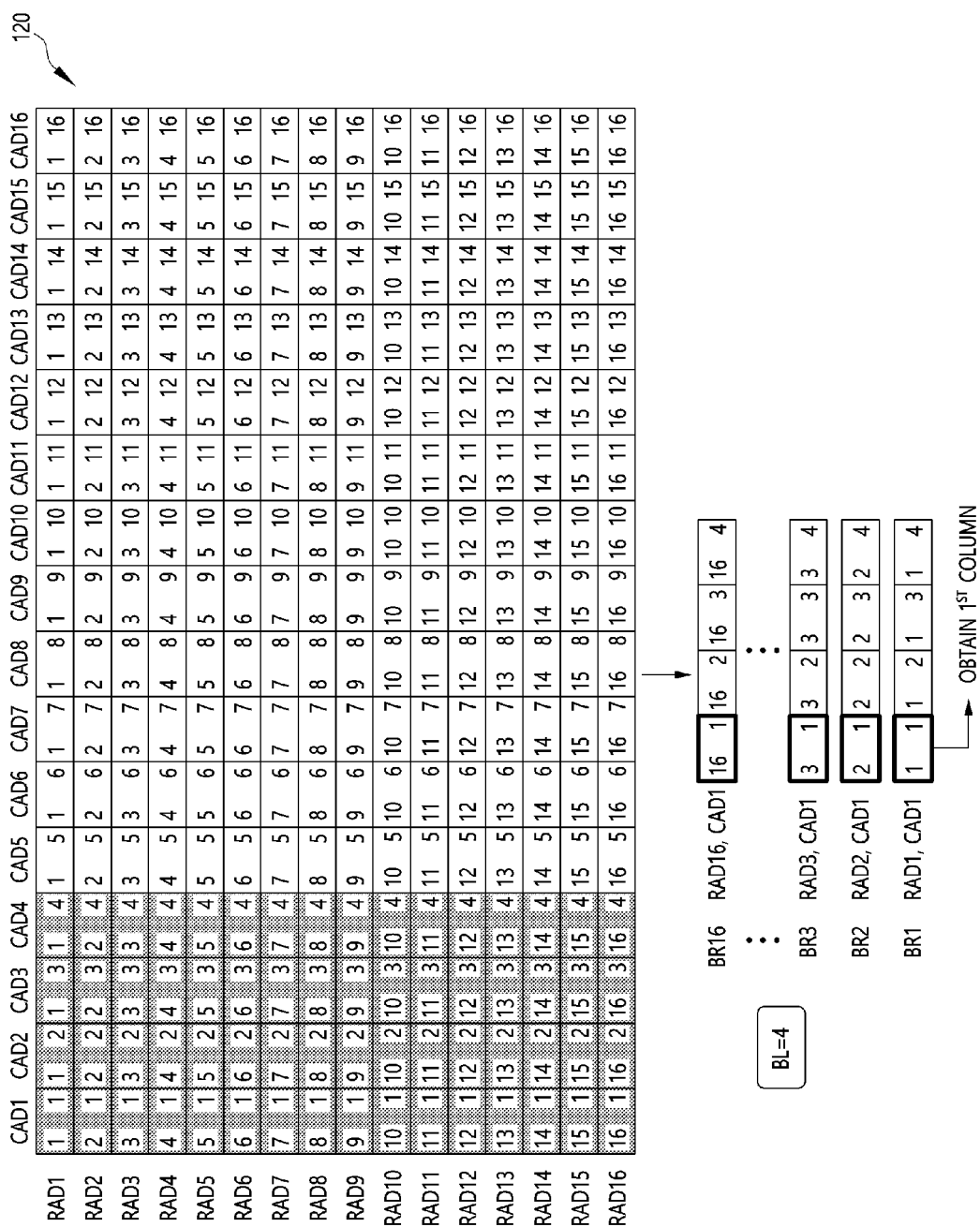
FIG. 5 is a diagram illustrating a process of obtaining a transposed matrix from the memory device through the burst read operation when the matrix is stored in the memory device according to the row major scheme according to an embodiment of the present disclosure.

FIG. 5 is a diagram illustrating a process of obtaining a transposed matrix from the memory device 120 through the burst read operation when the matrix is stored in the memory device 120 according to the row major scheme according to an embodiment of the present disclosure. In the embodiment of FIG. 5, the memory device 120 does not utilize the burst address gap BAG.

Referring to FIG. 5, the matrix may be stored in the memory device 120 according to the row major scheme, as described with reference to FIG. 3. The memory controller 110 may obtain the first column of the matrix through first to sixteenth burst read operations BR1 to BR16 for the burst length BL of a value four (4).

Specifically, the memory controller 110 may provide the memory device 120 with a first row address RAD1 and a first column address CAD1 for the first burst read operation BR1. As a result, the memory controller 110 may obtain elements of the first row and the first to fourth columns from the matrix.

The memory controller 110 may provide the memory device 120 with a second row address RAD2 and the first column address CAD1 for the second burst read operation BR2. As a result, the memory controller 110 may obtain elements of the second row and the first to fourth columns from the matrix.

In the similar way, elements of the first to fourth columns of each of the third to sixteenth rows may be obtained from the matrix respectively through the third to sixteenth burst read operations BR3 to BR16.

Upon completion of all the first to sixteenth burst read operations BR1 to BR16, the first to fourth columns may be read from the matrix. Among the read first to fourth columns, the first columns may be utilized as a first row of the transposed matrix and the remaining second to fourth columns may be temporarily stored in a separate memory (e.g., a SRAM) to be utilized as second to fourth rows of the transposed matrix.

To sum up, when a matrix is stored in the memory device 120 according to the row major scheme, it may take more of an amount of time and more resources to obtain a transposed matrix than an original matrix. Without the separate memory such as the SRAM, a number of read operations may seriously increase.

In a case that the matrix is stored in the memory device 120 according to the column major scheme, a process of obtaining the original and transposed matrixes may be performed in the same way as described above. When the matrix is stored in the memory device 120 according to the column major scheme, the transposed matrix may be obtained in the way described with reference to FIG. 4 and the original matrix may be obtained in the way described with reference to FIG. 5.

In an embodiment, through a variable burst address gap, a matrix may be efficiently stored in the memory device 120 and original and transposed matrixes may be obtained from the memory device 120 with a less of an amount of time and less resources, which will be described below.

Figure 6:
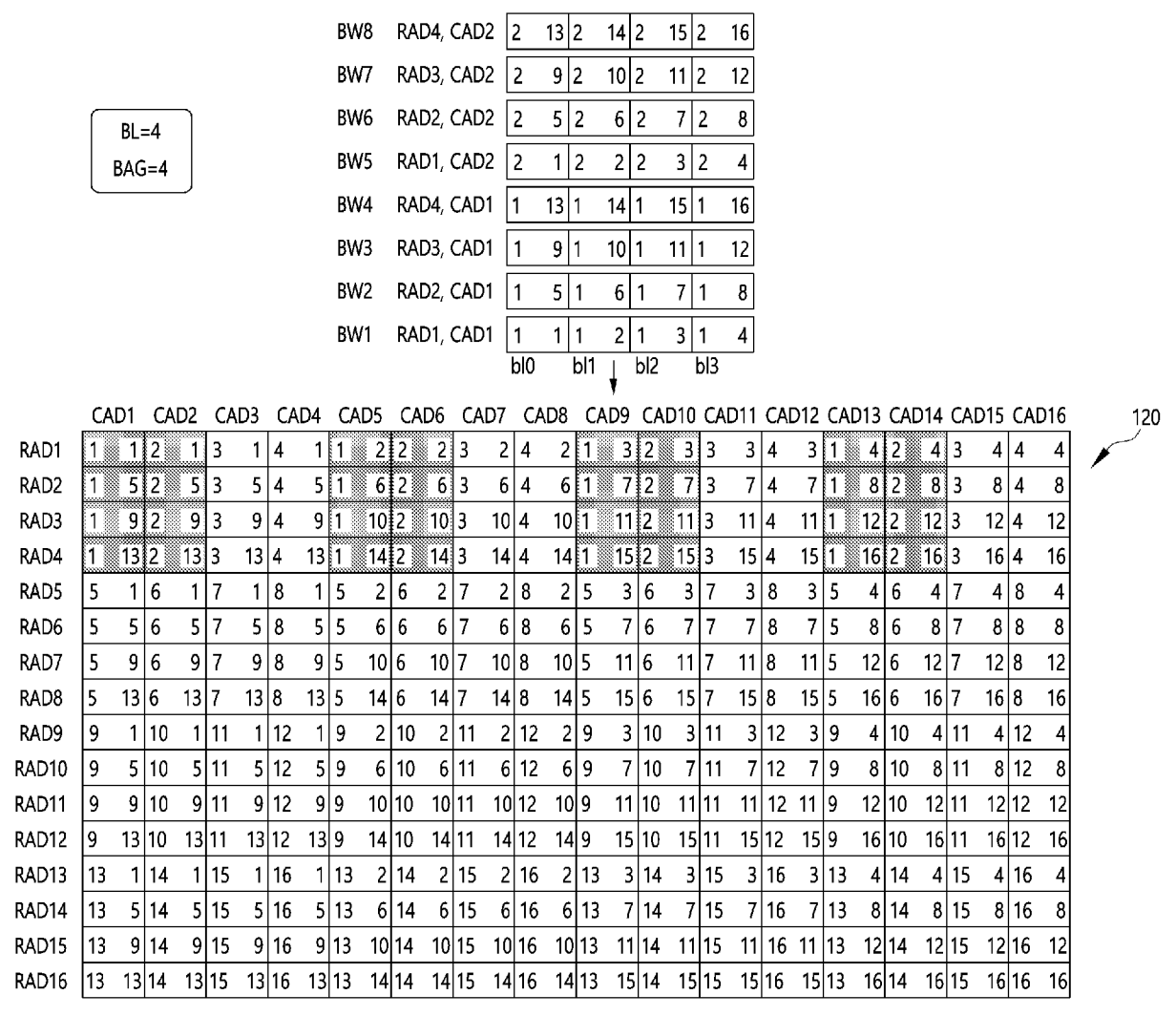

FIG. 6 is a diagram illustrating a process of storing a 16×16 matrix into the memory device 120 supporting the variable burst address gap according to an embodiment of the present disclosure.

Referring to FIG. 6, when the precision degree of the matrix the same as a number of data pins or a device input/output bit width of the memory device 120, an element of the matrix may be stored in a memory region identified by a single row address and a single column address within the memory device 120.

The memory controller 110 may store the matrix in the memory device 120 through a burst write operation for the burst length BL of a value four (4) and the burst address gap BAG of a value four (4). FIG. 6 shows four number of elements bl0, bl1, bl2 and bl3 that are consecutively provided to the memory device 120 when the burst length BL is of a value four (4). The memory controller 110 may utilize the same value for the burst address gap BAG and the burst length BL. In an embodiment, the memory controller 110 may utilize a value other than four (4) for the burst length BL and the burst address gap BAG.

Specifically, the memory controller 110 may store a first row of the matrix into the memory device 120 through first to fourth burst write operations BW1 to BW4.

For the first burst write operation BW1, the memory controller 110 may provide the memory device 120 with a first row address RAD1, a first column address CAD1 and elements bl0, bl1, bl2 and bl3 of first to fourth columns of a first row of the matrix. The memory device 120 may perform the first burst write operation BW1 for the burst length BL of a value four (4) and the burst address gap BAG of a value four (4) starting from the first column address CAD1 of the first row address RAD1.

For the second burst write operation BW2, the memory controller 110 may provide the memory device 120 with a second row address RAD2, the first column address CAD1 and elements bl0, bl1, bl2 and bl3 of fifth to eighth columns of the first row of the matrix. The memory device 120 may perform the second burst write operation BW2 for the burst length BL of a value four (4) and the burst address gap BAG of a value four (4) starting from the first column address CAD1 of the second row address RAD2.

For the third burst write operation BW3, the memory controller 110 may provide the memory device 120 with a third row address RAD3, the first column address CAD1 and elements bl0, bl1, bl2 and bl3 of ninth to twelfth columns of the first row of the matrix. The memory device 120 may perform the third burst write operation BW3 for the burst length BL of a value four (4) and the burst address gap BAG of a value four (4) starting from the first column address CAD1 of the third row address RAD3.

For the fourth burst write operation BW4, the memory controller 110 may provide the memory device 120 with a fourth row address RAD4, the first column address CAD1 and elements bl0, bl1, bl2 and bl3 of thirteenth to sixteenth columns of the first row of the matrix. The memory device 120 may perform the fourth burst write operation BW4 for the burst length BL of a value four (4) and the burst address gap BAG of a value four (4) starting from the first column address CAD1 of the fourth row address RAD4.

A second row of the matrix may be stored into the memory device 120 through fifth to eighth burst write operations BW5 to BW8 in a similar way to the first row of the matrix, as described above, by utilizing, as the start column address for storing the second row, a second column address CAD2 subsequent to the first column address CAD1 that is utilized as the start column address for storing the first row. A third row of the matrix may be stored into the memory device 120 by utilizing a third column address CAD3 as the start column address for storing the third row. A fourth row of the matrix may be stored into the memory device 120 by utilizing a fourth column address CAD4 as the start column address for storing the fourth row.

In a similar way, remaining rows of the matrix may be stored in pages corresponding to 4 number of row addresses per 4 number of rows.

In an embodiment, determined according to following equation 1 may be an address of a memory region in which a (i, j)th element of a matrix is stored within the memory device 120 supporting the variable burst address gap.

$$\text{Address of a memory region in which } a(i,j)\text{th element of a matrix is stored} = \text{Baddr} + (i - i\%(bl+1)) \\ *\text{Mcol} + i\%(bl+1) - 1 + (j-1)bl \quad \text{[Equation 1]}$$

In equation 1, "Baddr" may represent an address of a memory region in which a (1, 1)th element of the matrix is stored. "Mcol" may represent a number of columns of the matrix. "%" may represent a modulo operation. "bl" may represent the burst length BL. The burst address gap BAG may be set to have the same value as the burst length BL.

In an embodiment, burst write operations (e.g., the first to fourth burst write operations BW1 to BW4) for storing each row (e.g., the first row) of the matrix may be performed as many times as a value obtained by dividing a number of elements (e.g., sixteen (16)) configuring each row by the burst length BL (e.g., four (4)). Row addresses for the burst write operations (e.g., the first to fourth burst write operations BW1 to BW4) for storing each row (e.g., the first row) of the matrix may be consecutive row addresses (e.g., the first to fourth rows addresses RAD1 to RAD4) starting from a row address (e.g., the first row address RAD1) of an initial element of each row of the matrix, which is determined by equation 1. Each of start column addresses for the burst write operations (e.g., the first to fourth burst write operations BW1 to BW4) for storing each row (e.g., the first row) of the matrix may be a column address (e.g., the first column address CAD1) of an initial element of the row of the matrix, which is determined by equation 1. An initial element of each row of the matrix may be an element of a first column of the row of the matrix.

FIG. 7 is a diagram illustrating a process of obtaining an original matrix from the memory device 120 through a burst read operation according to an embodiment of the present disclosure.

Referring to FIG. 7, the matrix may be stored in the memory device 120 as described with reference to FIG. 6. When the original matrix is required, the memory controller 110 may read the first row of the matrix through first to fourth burst read operations BR1 to BR4. The burst length BL may be of a value four (4). That is, the value of the burst length BL that is utilized when reading the matrix from the memory device 120 may be the same as the burst length BL that is utilized when storing the matrix into the memory device 120. The burst address gap BAG may be of a value four (4). That is, the value of the burst address gap BAG that is utilized when reading a row of the matrix from the memory device 120 may be the same as the burst address gap BAG that is utilized when storing a row of the matrix into the memory device 120. That is, the value of the burst address gap BAG may be the same as the burst length BL.

For the first burst read operation BR1, the memory controller 110 may provide the memory device 120 with a first row address RAD1 and a first column address CAD1. The memory device 120 may perform the first burst read operation BR1 for the burst address gap BAG of a value four (4) starting from the first column address CAD1 of the first row address RAD1. As a result, the memory controller 110 may obtain the elements of the first to fourth columns of the first row within the matrix.

For the second burst read operation BR2, the memory controller 110 may provide the memory device 120 with a second row address RAD2 and the first column address CAD1. The memory device 120 may perform the second burst read operation BR2 for the burst address gap BAG of a value four (4) starting from the first column address CAD1 of the second row address RAD2. As a result, the memory controller 110 may obtain the elements of the fifth to eighth columns of the first row within the matrix.

For the third burst read operation BR3, the memory controller 110 may provide the memory device 120 with a third row address RAD3 and the first column address CAD1. The memory device 120 may perform the third burst read operation BR3 for the burst address gap BAG of a value four (4) starting from the first column address CAD1 of the third row address RAD3. As a result, the memory controller 110 may obtain the elements of the ninth to twelfth columns of the first row within the matrix.

For the fourth burst read operation BR4, the memory controller 110 may provide the memory device 120 with a fourth row address RAD4 and the first column address CAD1. The memory device 120 may perform the fourth burst read operation BR4 for the burst address gap BAG of a value four (4) starting from the first column address CAD1 of the fourth row address RAD4. As a result, the memory controller 110 may obtain the elements of the thirteenth to sixteenth columns of the first row within the matrix.

A second row of the matrix may be obtained from the memory device 120 in a similar way to the first row of the matrix, as described above, by utilizing, as the start column address for reading the second row, a second column address CAD2 subsequent to the first column address CAD1 that is utilized as the start column address for reading the first row. That is, each row of the matrix may be obtained from the memory device 120 through a process opposite to the process of storing the row into the memory device 120.

In an embodiment, burst read operations (e.g., the first to fourth burst read operations BR1 to BR4) for reading each row (e.g., the first row) of the matrix may be performed as many times as a value obtained by dividing a number of elements (e.g., sixteen (16)) configuring each row by the burst length BL (e.g., four (4)). Row addresses for the burst read operations (e.g., the first to fourth burst read operations BR1 to BR4) for reading each row (e.g., the first row) of the matrix may be consecutive row addresses (e.g., the first to fourth row addresses RAD1 to RAD4) starting from a row address (e.g., the first row address RAD1) of an initial element of each row of the matrix, which is determined by equation 1. Each of start column addresses for the burst read operations (e.g., the first to fourth burst read operations BR1 to BR4) for reading each row (e.g., the first row) of the matrix may be a column address (e.g., the first column address CAD1) of an initial element of the row of the matrix, which is determined by equation 1. An initial element of each row of the matrix may be an element of a first column of the row of the matrix.

Figure 8:
FIG. 8 is a diagram illustrating a process of obtaining a transposed matrix from the memory device through the burst read operation according to an embodiment of the present disclosure.

FIG. 8 is a diagram illustrating a process of obtaining a transposed matrix from the memory device 120 through the burst read operation according to an embodiment of the present disclosure.

Referring to FIG. 8, the matrix may be stored in the memory device 120 as described with reference to FIG. 6. When the transposed matrix is required, the memory controller 110 may read the first column of the matrix through first to fourth burst read operations BR1 to BR4. The burst length BL may be of a value four (4). That is, the value of the burst length BL that is utilized when reading the matrix from the memory device 120 may be the same as the burst length BL that is utilized when storing the matrix into the memory device 120. The burst address gap BAG may be of a value one (1). That is, the value of the burst address gap BAG that is utilized when reading a column of the matrix from the memory device 120 may be different from the burst address gap BAG that is utilized when reading a row of the matrix from the memory device 120.

For the first burst read operation BR1, the memory controller 110 may provide the memory device 120 with a first row address RAD1 and a first column address CAD1. The memory device 120 may perform the first burst read operation BR1 for the burst address gap BAG of a value one (1) starting from the first column address CAD1 of the first row address RAD1. As a result, the memory controller 110 may obtain the elements of the first column of the first to fourth rows within the matrix.

For the second burst read operation BR2, the memory controller 110 may provide the memory device 120 with a fifth row address RAD5 and the first column address CAD1. The memory device 120 may perform the second burst read operation BR2 for the burst address gap BAG of a value one (1) starting from the first column address CAD1 of the fifth row address RAD5. As a result, the memory controller 110 may obtain the elements of the first column of the fifth to eighth rows within the matrix.

For the third burst read operation BR3, the memory controller 110 may provide the memory device 120 with a ninth row address RAD9 and the first column address CAD1. The memory device 120 may perform the third burst read operation BR3 for the burst address gap BAG of a value one (1) starting from the first column address CAD1 of the ninth row address RAD9. As a result, the memory controller 110 may obtain the elements of the first column of the ninth to twelfth rows within the matrix.

For the fourth burst read operation BR4, the memory controller 110 may provide the memory device 120 with a thirteenth row address RAD13 and the first column address CAD1. The memory device 120 may perform the fourth burst read operation BR4 for the burst address gap BAG of a value one (1) starting from the first column address CAD1 of the thirteenth row address RAD13. As a result, the memory controller 110 may obtain the elements of the first column of the thirteenth to sixteenth rows within the matrix.

A second column of the matrix may be obtained from the memory device 120 in the similar way to the first column of the matrix, as described above, by utilizing, as the start column address for reading the second column, a fifth column address CAD5 greater by an amount of the burst length BL than the first column address CAD1 that is utilized as the start column address for reading the first column.

In an embodiment, burst read operations (e.g., the first to fourth burst read operations BR1 to BR4) for reading each column (e.g., the first column) of the matrix may be performed as many times as a value obtained by dividing a number of elements (e.g., sixteen (16)) configuring each column by the burst length BL (e.g., four (4)). Row addresses for the burst read operations (e.g., the first to fourth burst read operations BR1 to BR4) for reading each column (e.g., the first column) of the matrix may be row addresses (e.g., the first, fifth, ninth and thirteenth row addresses RAD1, RAD5, RAD9 and RAD13) starting from a row address (e.g., the first row address RAD1) of an initial element of the column of the matrix, which is determined by equation 1, and having the numerical difference between adjacent ones by an amount of the burst length BL (e.g., four (4)). Each of the start column addresses for the burst read operations (e.g., the first to fourth burst read operations BR1 to BR4) for reading each column (e.g., the first column) of the matrix may be a column address (e.g., the first column address CAD1) of an initial element of the column of the matrix, which is determined by equation 1. An initial element of each column of the matrix may be an element of the column of a first row of the matrix.

When comparing the burst read operation of FIG. 8 with the burst read operation of FIG. 5 for obtaining the transposed matrix, the process of obtaining the transposed matrix as illustrated in FIG. 8 may substantially reduce a number of times that the burst read operations are performed and thus may improve the operation speed and reduce the power consumption. The process of obtaining the transposed matrix as illustrated in FIG. 8 requires 4 number of burst read operations to read only the first column of the matrix, which does not require the separate memory for temporarily storing other columns therein as illustrated in FIG. 5 and thus may save a cost for the separate memory.

In an embodiment, any column of the matrix other than the transposed matrix of the matrix may be read according to the process described with reference to FIG. 8.

Figure 9:
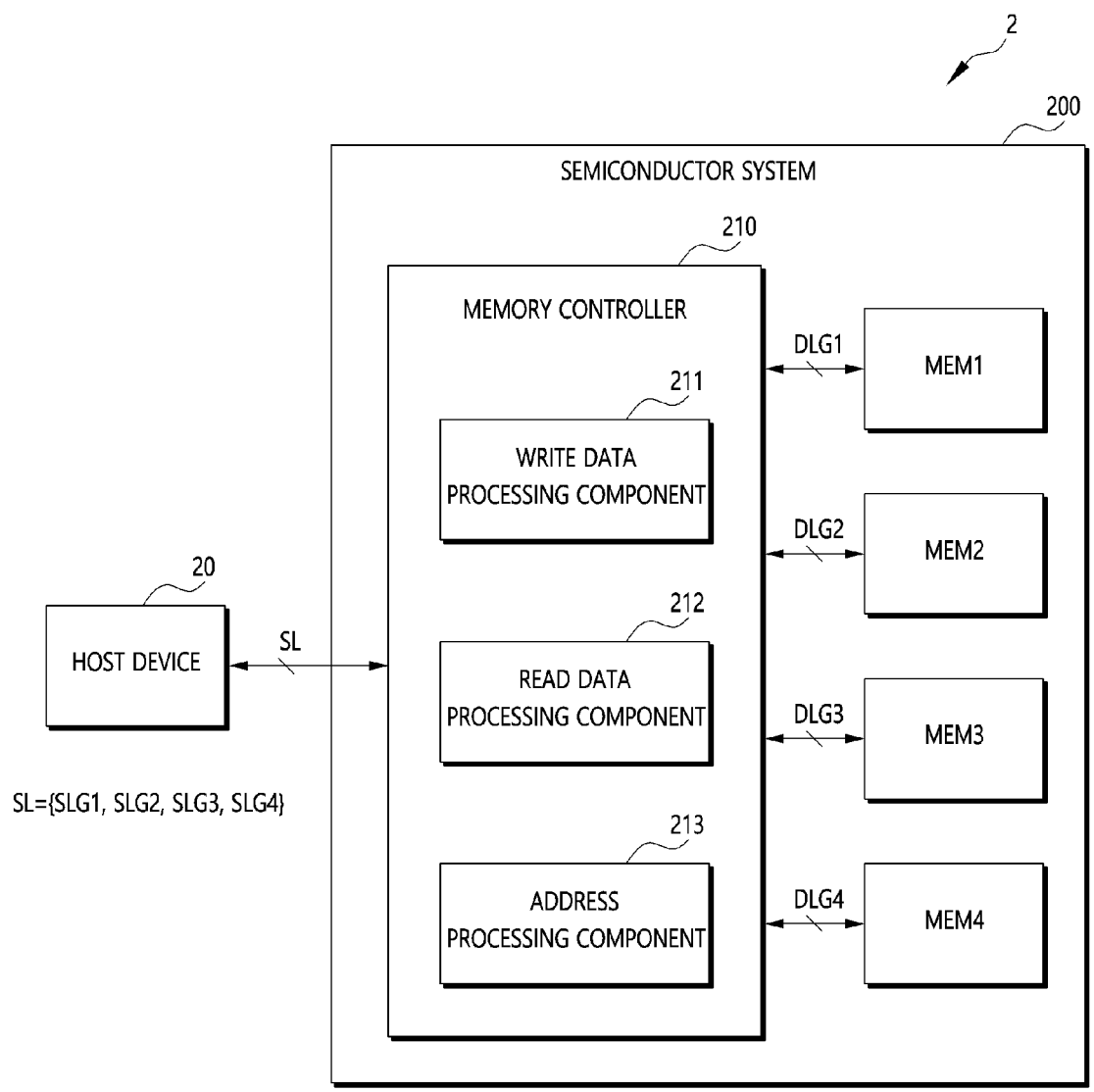
FIG. 9 is a block diagram illustrating a data processing system including a semiconductor system according to an embodiment of the present disclosure.

FIG. 9 is a block diagram illustrating a data processing system 2 including a semiconductor system 200 according to an embodiment of the present disclosure.

Referring to FIG. 9, the data processing system 2 may include a host device 20 and the semiconductor system 200.

In order to store data into the semiconductor system 200 and read data from the semiconductor system 200, the host device 20 may control the semiconductor system 200. The host device 20 may be coupled to the semiconductor system 200 through a plurality of system lines SL and may exchange data with the semiconductor system 200 through the plurality of system lines SL.

The semiconductor system 200 may include a memory controller 210 and first to fourth memory devices MEM1 to MEM4.

The memory controller 210 may control write and read operations of the first to fourth memory devices MEM1 to MEM4 under the control of the host device 20.

The memory controller 210 may be coupled to the host device 20 through the plurality of system lines SL. A host input/output bit width may be a number of bits that are transferred in parallel between the host device 20 and the memory controller 210 through the plurality of system lines SL, at a time.

The memory controller 210 may be coupled to the first to fourth memory devices MEM1 to MEM4 through first to fourth device line groups DLG1 to DLG4, respectively. Each of the first to fourth device line groups DLG1 to DLG4 may be configured by a plurality of device lines. A device input/output bit width may be a number of data bits that are transferred in parallel between the memory controller 210 and any of the first to fourth memory devices MEM1 to MEM4 through a corresponding one of the first to fourth device line groups DLG1 to DLG4, at a time. That is, a device input/output bit width may be a bit-size of the data set DQ as discussed with reference to FIG. 3. The device input/output bit width may represent a number of data pins or DQ pins of each of the first to fourth memory devices MEM1 to MEM4.

Therefore, the host input/output bit width may be four (4) times as great as the device input/output bit width, four (4) being a number of the first to fourth memory devices MEM1 to MEM4 included in the semiconductor system 200. For example, when the device input/output bit width of each of the first to fourth memory devices MEM1 to MEM4 is 8, the host input/output bit width may be 32.

As described later, the memory controller 210 may divide the plurality of system lines SL into first to fourth system line groups SLG1 to SLG4. A number of the first to fourth system line groups SLG1 to SLG4 may be the same as the number of the first to fourth memory devices MEM1 to MEM4. Each of the first to fourth system line groups SLG1 to SLG4 may have the same bit width as each of the first to fourth device line groups DLG1 to DLG4. A bit width may be a number of data bits that are transferred at a time. For example, when the plurality of system lines SL transfers [31:0] bits, the first to fourth system line groups SLG1 to SLG4 may respectively transfer [7:0] bits, [15:8] bits, [23:16] bits and [31:24] bits.

The memory controller 210 may include a write data processing component 211, a read data processing component 212 and an address conversion component 213.

The write data processing component 211 may map, based on base device information provided from the host device 20, the first to fourth system line groups SLG1 to SLG4 respectively to the first to fourth device line groups DLG1 to DLG4. The write data processing component 211 may transfer data provided from the host device 20 through each system line group to a device line group mapped to the system line group. The base device information may indicate, as a base device, one among the first to fourth memory devices MEM1 to MEM4. The based device may be selected by the host device 20.

The read data processing component 212 may map, based on the base device information provided from the host device 20, the first to fourth system line groups SLG1 to SLG4 respectively to the first to fourth device line groups DLG1 to DLG4. The read data processing component 212 may transfer data provided from each memory device through a corresponding device line group to a system line group mapped to the device line group.

For read operations of the respective first to fourth memory devices MEM1 to MEM4, the address conversion component 213 may convert, based on the base device information provided from the host device 20, a base address into first to fourth device addresses to be provided to the respective first to fourth memory devices MEM1 to MEM4. The base address may be an address provided together with a read command from the host device 20.

The first to fourth memory devices MEM1 to MEM4 may perform respective write or read operations in a parallel way under the control of the memory controller 210. Although FIG. 9 shows the semiconductor system 200 including 4 number of memory devices MEM1 to MEM4, a number of the memory devices included in the semiconductor system 200 will not be limited thereto according to an embodiment.

Figure 10:
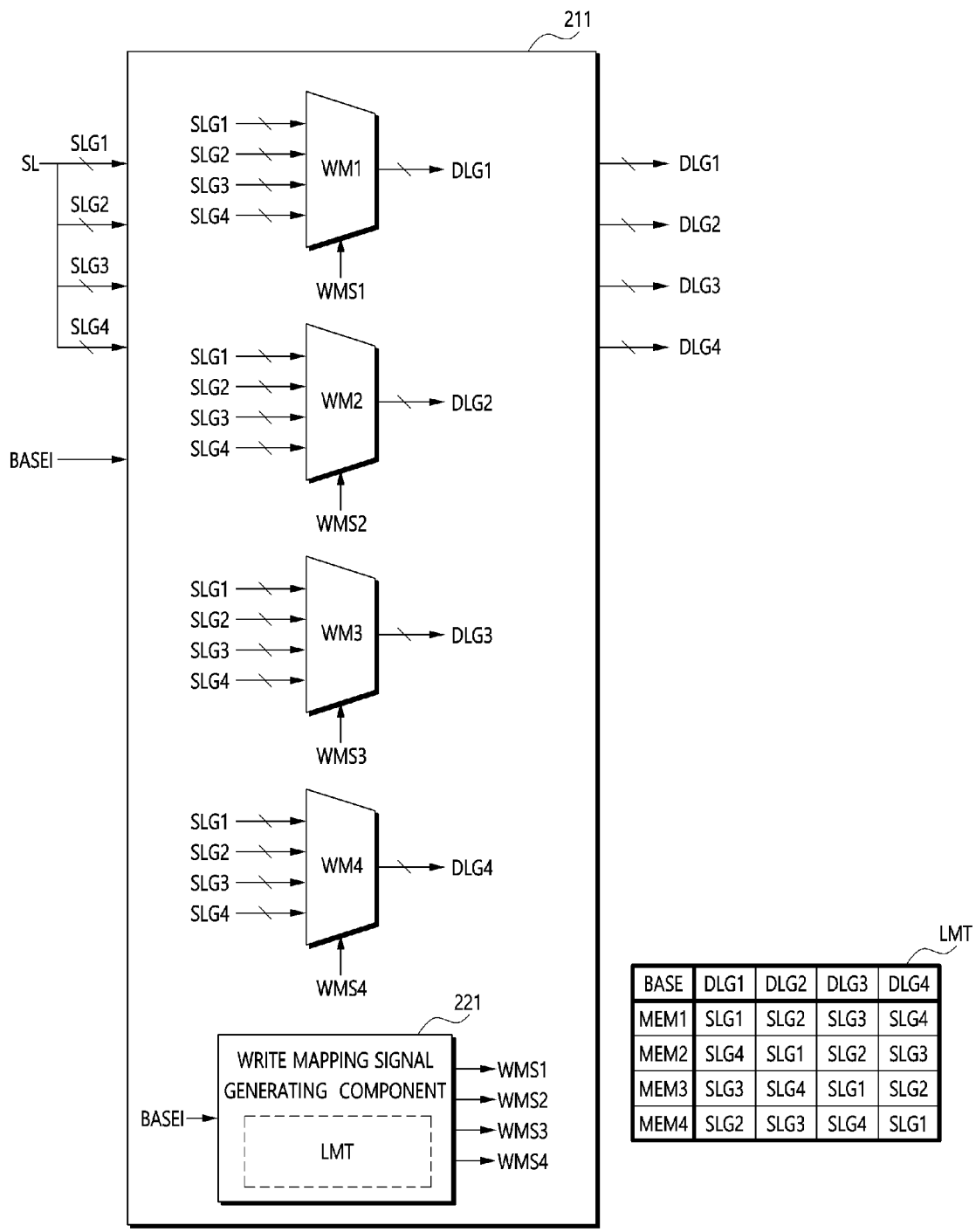
FIG. 10 is a block diagram illustrating a write data processing component of FIG. 9 according to an embodiment of the present disclosure.

FIG. 10 is a block diagram illustrating the write data processing component 211 of FIG. 9 according to an embodiment of the present disclosure.

In this disclosure, a device order may be a predetermined order of the first to fourth memory devices MEM1 to MEM4. For example, the device order may be an order from the first memory device MEM1 to the fourth memory device MEM4. The first to fourth memory devices MEM1 to MEM4 may circulate according to the device order. For example, the first memory device MEM1 may be subsequent the fourth memory device MEM4 according to the device order. An order of the first to fourth device line groups DLG1 to DLG4 may be the same as the device order of the first to fourth memory devices MEM1 to MEM4.

Referring to FIG. 10, the write data processing component 211 may perform, based on the base device information BASEI, a line mapping operation of mapping the first to fourth device line groups DLG1 to DLG4 respectively to the first to fourth system line groups SLG1 to SLG4, which are divided from the plurality of system lines SL. The write data processing component 211 may transfer data, which are provided from the respective first to fourth system line groups SLG1 to SLG4, to the device line groups respectively mapped to the system line groups.

The write data processing component 211 may perform a line mapping operation based on a line mapping table LMT. The line mapping table LMT may represent a mapping relationship between the first to fourth device line groups DLG1 to DLG4 and the first to fourth system line groups SLG1 to SLG4 according to a base device BASE determined by the base device information BASEI. For example, the line mapping table LMT may include information of the system line groups, which are respectively mapped to the first to fourth device line groups DLG1 to DLG4 according to the base device BASE.

The write data processing component 211 may map the first to fourth system line groups SLG1 to SLG4 sequentially to the device line groups according to the device order starting from a device line group corresponding to the base device BASE. As shown from the line mapping table LMT illustrated in FIG. 10, when the base device BASE is the first memory device MEM1, the first to fourth system line groups SLG1 to SLG4 may be mapped sequentially to the first to fourth device line groups DLG1 to DLG4 according to the device order starting from the first device line group DLG1. When the base device BASE is the second memory device MEM2, the first to fourth system line groups SLG1 to SLG4 may be mapped sequentially to the second, third, fourth and first device line groups DLG2, DLG3, DLG4 and DLG1 according to the device order starting from the second device line group DLG2. When the base device BASE is the third memory device MEM3, the first to fourth system line groups SLG1 to SLG4 may be mapped sequentially to the third, fourth, first and second device line groups DLG3, DLG4, DLG1 and DLG2 according to the device order starting from the third device line group DLG3. When the base device BASE is the fourth memory device MEM4, the first to fourth system line groups SLG1 to SLG4 may be mapped sequentially to the fourth, first, second and third device line groups DLG4, DLG1, DLG2 and DLG3 according to the device order starting from the fourth device line group DLG4.

The write data processing component 211 may include a write mapping signal generating component 221 and first to fourth write multiplexers WM1 to WM4 respectively corresponding to the first to fourth device line groups DLG1 to DLG4. A number of the first to fourth write multiplexers WM1 to WM4 may be the same as the first to fourth memory devices MEM1 to MEM4.

The first to fourth system line groups SLG1 to SLG4 may be coupled to input nodes of each of the first to fourth write multiplexers WM1 to WM4. An output node of each of the first to fourth write multiplexers WM1 to WM4 may be coupled to a corresponding one of the first to fourth device line groups DLG1 to DLG4. For example, the output nodes of the first to fourth write multiplexers WM1 to WM4 may be coupled to the first to fourth device line groups DLG1 to DLG4, respectively. Each of the first to fourth write multiplexers WM1 to WM4 may select one of the first to fourth system line groups SLG1 to SLG4 and may transfer data from the selected system line group to a device line group coupled to the write multiplexer. The selected system line group may be mapped to the device line group coupled to the write multiplexer. The first to fourth write multiplexers WM1 to WM4 may select ones of the first to fourth system line groups SLG1 to SLG4 in response to first to fourth write mapping signals WMS1 to WMS4, respectively. The selected system line groups may be mapped to ones coupled to the first to fourth write multiplexers WM1 to WM4 among the first to fourth device line groups DLG1 to DLG4, respectively.

The write mapping signal generating component 221 may generate, based on the base device information BASEI, the first to fourth write mapping signals WMS1 to WMS4 respectively corresponding to the first to fourth device line groups DLG1 to DLG4. Based on the base device BASE determined by the base device information BASEI, the write mapping signal generating component 221 may generate the first to fourth write mapping signals WMS1 to WMS4 to indicate the system line groups mapped to the device line groups corresponding thereto, respectively. For example, the write mapping signal generating component 221 may refer to the line mapping table LMT to generate the first to fourth write mapping signals WMS1 to WMS4.

For example, when the base device BASE is the first memory device MEM1, the write mapping signal generating component 221 may generate the first to fourth write mapping signals WMS1 to WMS4 to indicate the first to fourth system line groups SLG1 to SLG4, respectively. When the base device BASE is the second memory device MEM2, the write mapping signal generating component 221 may generate the first to fourth write mapping signals WMS1 to WMS4 to indicate the fourth, first, second and third system line groups SLG4, SLG1, SLG2 and SLG3, respectively. When the base device BASE is the third memory device MEM3, the write mapping signal generating component 221 may generate the first to fourth write mapping signals WMS1 to WMS4 to indicate the third, fourth, first and second system line groups SLG3, SLG4, SLG1 and SLG2, respectively. When the base device BASE is the fourth memory device MEM4, the write mapping signal generating component 221 may generate the first to fourth write mapping signals WMS1 to WMS4 to indicate the second, third, fourth and first system line groups SLG2, SLG3, SLG4 and SLG1, respectively.

Figure 11:
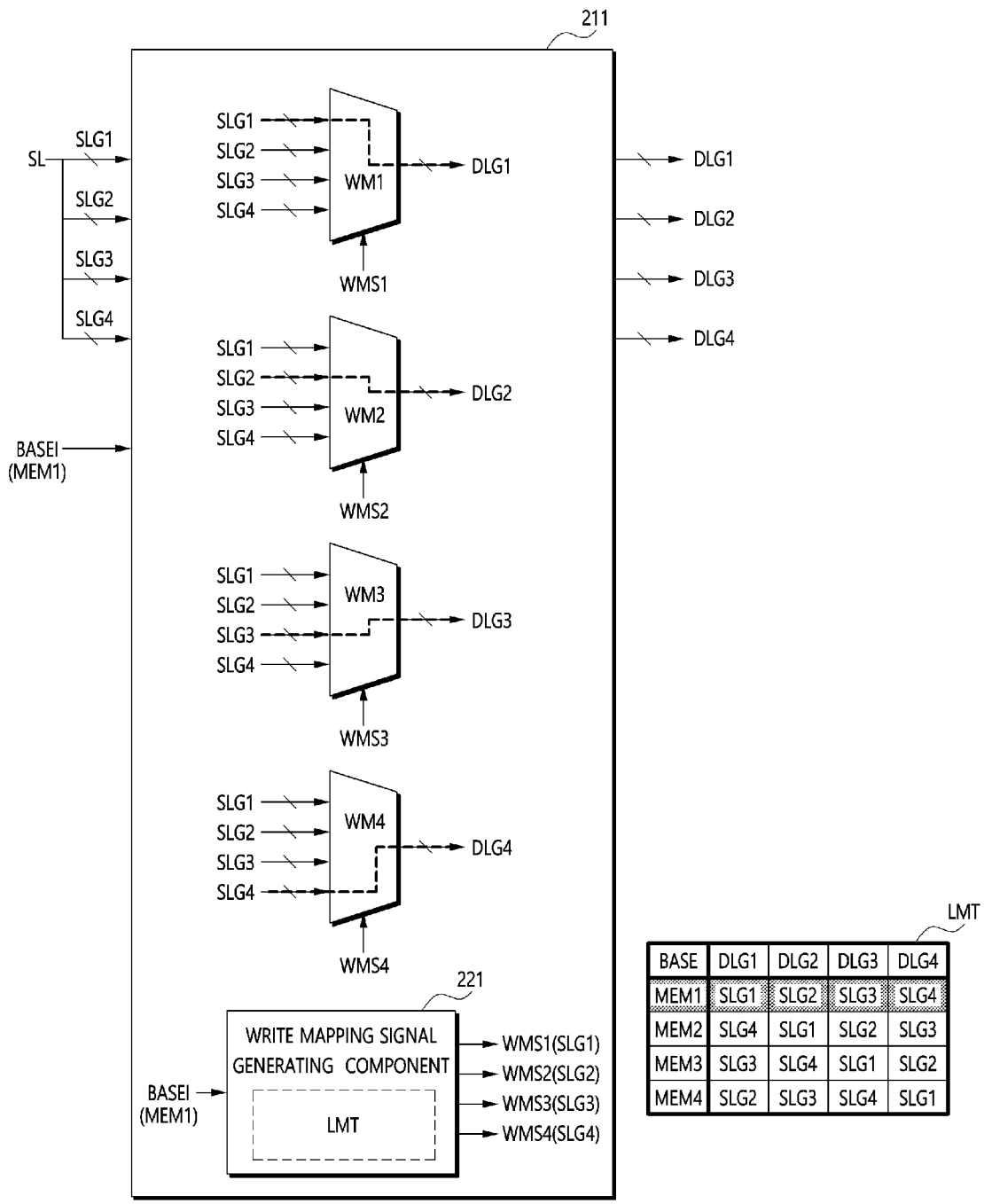
FIGS. 11 and 12 are diagrams illustrating a line mapping operation of the write data processing component of FIG. 10 according to an embodiment of the present disclosure.
Figure 12:
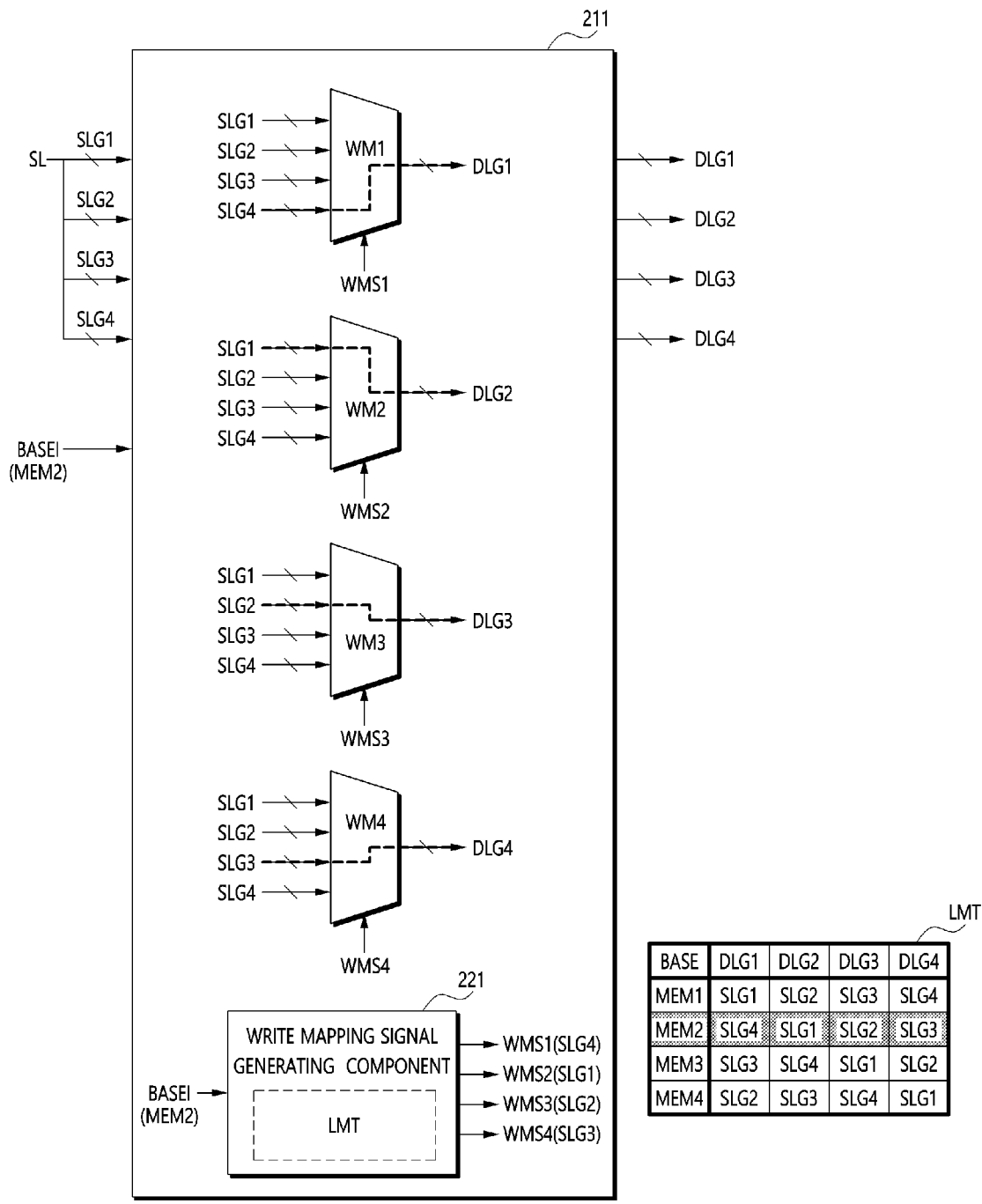

FIGS. 11 and 12 are diagrams illustrating a line mapping operation of the write data processing component 211 of FIG. 10 according to an embodiment of the present disclosure.

Referring to FIG. 11, the base device information BASEI may indicate the first memory device MEM1 as the base device BASE. In this case, the write data processing component 211 may operate as follows.

The write mapping signal generating component 221 may generate, in response to the base device information BASEI, the first to fourth write mapping signals WMS1 to WMS4 respectively indicating the first to fourth system line groups SLG1 to SLG4.

In response to the first write mapping signal WMS1, the first write multiplexer WM1 may transfer, to the first device line group DLG1, data from the first system line group SLG1 among the first to fourth system line groups SLG1 to SLG4.

In response to the second write mapping signal WMS2, the second write multiplexer WM2 may transfer, to the second device line group DLG2, data from the second system line group SLG2 among the first to fourth system line groups SLG1 to SLG4.

In response to the third write mapping signal WMS3, the third write multiplexer WM3 may transfer, to the third device line group DLG3, data from the third system line group SLG3 among the first to fourth system line groups SLG1 to SLG4.

In response to the fourth write mapping signal WMS4, the fourth write multiplexer WM4 may transfer, to the fourth device line group DLG4, data from the fourth system line group SLG4 among the first to fourth system line groups SLG1 to SLG4.

Referring to FIG. 12, the base device information BASEI may indicate the second memory device MEM2 as the base device BASE according to an embodiment of the present disclosure. In this case, the write data processing component 211 may operate as follows.

The write mapping signal generating component 221 may generate, in response to the base device information BASEI, the first to fourth write mapping signals WMS1 to WMS4 respectively indicating the fourth, first, second and third system line groups SLG4, SLG1, SLG2 and SLG3.

In response to the first write mapping signal WMS1, the first write multiplexer WM1 may transfer, to the first device line group DLG1, data from the fourth system line group SLG4 among the first to fourth system line groups SLG1 to SLG4.

In response to the second write mapping signal WMS2, the second write multiplexer WM2 may transfer, to the second device line group DLG2, data from the first system line group SLG1 among the first to fourth system line groups SLG1 to SLG4.

In response to the third write mapping signal WMS3, the third write multiplexer WM3 may transfer, to the third device line group DLG3, data from the second system line group SLG2 among the first to fourth system line groups SLG1 to SLG4.

In response to the fourth write mapping signal WMS4, the fourth write multiplexer WM4 may transfer, to the fourth device line group DLG4, data from the third system line group SLG3 among the first to fourth system line groups SLG1 to SLG4.

Figure 13:
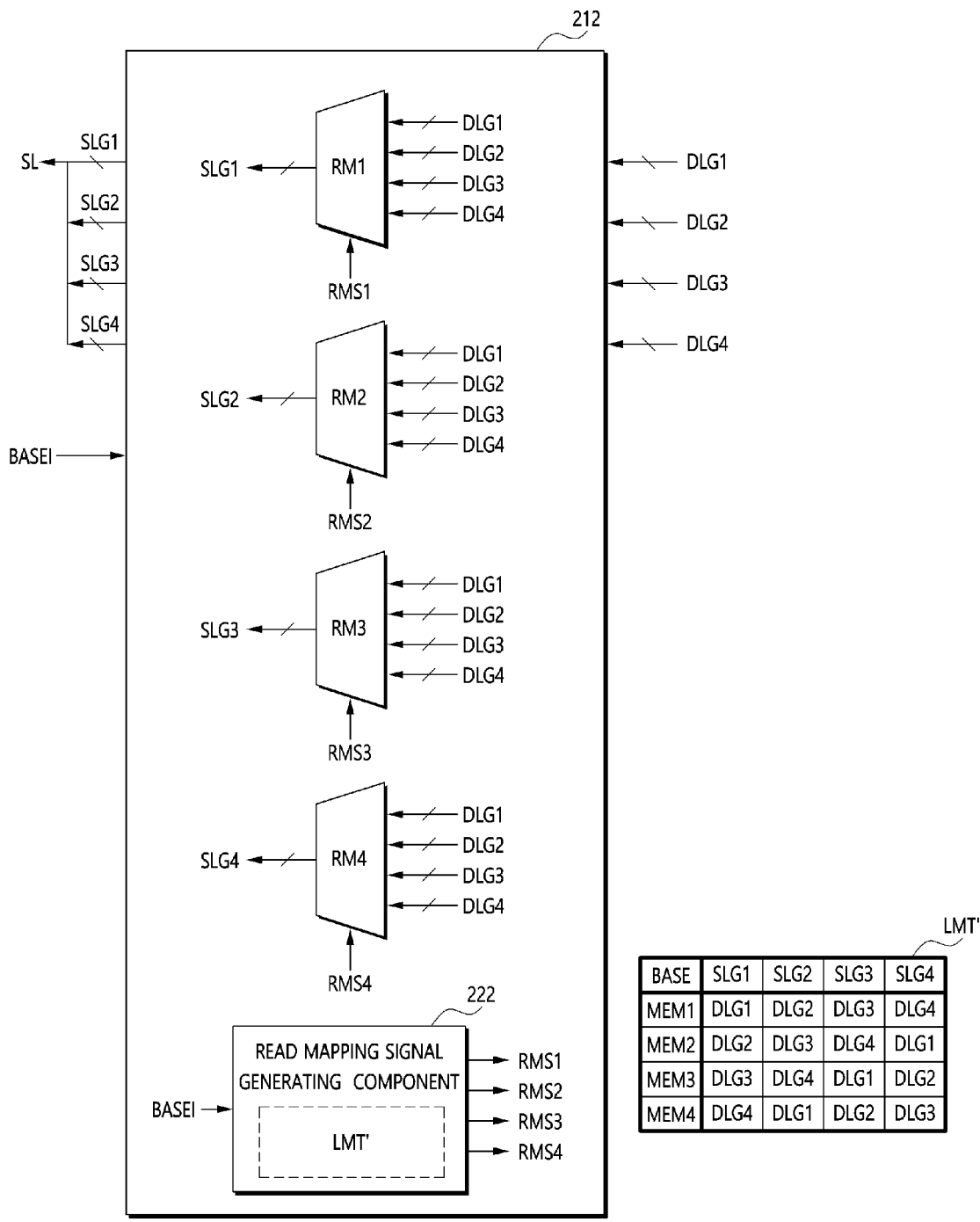
FIG. 13 is a block diagram illustrating a read data processing component of FIG. 9 according to an embodiment of the present disclosure.

FIG. 13 is a block diagram illustrating the read data processing component 212 of FIG. 9 according to an embodiment of the present disclosure.

Referring to FIG. 13, the read data processing component 212 may perform, based on the base device information BASEI, a line mapping operation of mapping the first to fourth device line groups DLG1 to DLG4 respectively to the first to fourth system line groups SLG1 to SLG4. The read data processing component 212 may transfer data, which are provided from the respective first to fourth device line groups DLG1 to DLG4, to the system line groups respectively mapped to the device line groups.

The read data processing component 212 may perform a line mapping operation based on a line mapping table LMT'.

The line mapping table LMT' may represent a mapping relationship between the first to fourth device line groups DLG1 to DLG4 and the first to fourth system line groups SLG1 to SLG4 according to a base device BASE. For example, the line mapping table LMT' may include information of the device line groups, which are respectively mapped to the first to fourth system line groups SLG1 to SLG4 according to the base device BASE.

The line mapping table LMT' may include information of substantially the same mapping relationship as the line mapping table LMT to which the write data processing component 211 refers. Therefore, a result of the line mapping operation performed by the read data processing component 212 may be the same as the line mapping operation performed by the write data processing component 211. The read data processing component 212 may map the first to fourth system line groups SLG1 to SLG4 sequentially to the device line groups according to the device order starting from a device line group corresponding to the base device BASE.

The read data processing component 212 may include a read mapping signal generating component 222 and first to fourth read multiplexers RM1 to RM4 respectively corresponding to the first to fourth system line groups SLG1 to SLG4. A number of the first to fourth read multiplexers RM1 to RM4 may be the same as the first to fourth memory devices MEM1 to MEM4.

The first to fourth device line groups DLG1 to DLG4 may be coupled to input nodes of each of the first to fourth read multiplexers RM1 to RM4. An output node of each of the first to fourth read multiplexers RM1 to RM4 may be coupled to a corresponding one of the first to fourth system line groups SLG1 to SLG4. For example, the output nodes of the first to fourth read multiplexers RM1 to RM4 may be coupled to the first to fourth system line groups SLG1 to SLG4, respectively. Each of the first to fourth read multiplexers RM1 to RM4 may select one of the first to fourth device line groups DLG1 to DLG4 and may transfer data from the selected device line group to a system line group coupled to the read multiplexer. The selected device line group may be mapped to the system line group coupled to the read multiplexer. The first to fourth read multiplexers RM1 to RM4 may select ones of the first to fourth device line groups DLG1 to DLG4 in response to first to fourth read mapping signals RMS1 to RMS4, respectively. The selected device line groups may be mapped to ones coupled to the first to fourth read multiplexers RM1 to RM4 among the first to fourth system line groups SLG1 to SLG4, respectively.

The read mapping signal generating component 222 may generate, based on the base device information BASEI, the first to fourth read mapping signals RMS1 to RMS4 respectively corresponding to the first to fourth system line groups SLG1 to SLG4. Based on the base device BASE, the read mapping signal generating component 222 may generate the first to fourth read mapping signals RMS1 to RMS4 to indicate the device line groups mapped to the system line groups corresponding thereto, respectively. For example, the read mapping signal generating component 222 may refer to the line mapping table LMT' to generate the first to fourth read mapping signals RMS1 to RMS4.

For example, when the base device BASE is the first memory device MEM1, the read mapping signal generating component 222 may generate the first to fourth read mapping signals RMS1 to RMS4 to indicate the first to fourth device line groups DLG1 to DLG4, respectively. When the base device BASE is the second memory device MEM2, the read mapping signal generating component 222 may generate the first to fourth read mapping signals RMS1 to RMS4 to indicate the second, third, fourth and first device line groups DLG2, DLG3, DLG4 and DLG1, respectively. When the base device BASE is the third memory device MEM3, the read mapping signal generating component 222 may generate the first to fourth read mapping signals RMS1 to RMS4 to indicate the third, fourth, first and second device line groups DLG3, DLG4, DLG1 and DLG2, respectively. When the base device BASE is the fourth memory device MEM4, the read mapping signal generating component 222 may generate the first to fourth read mapping signals RMS1 to RMS4 to indicate the fourth, first, second and third device line groups DLG4, DLG1, DLG2 and DLG3, respectively.

Figure 14:
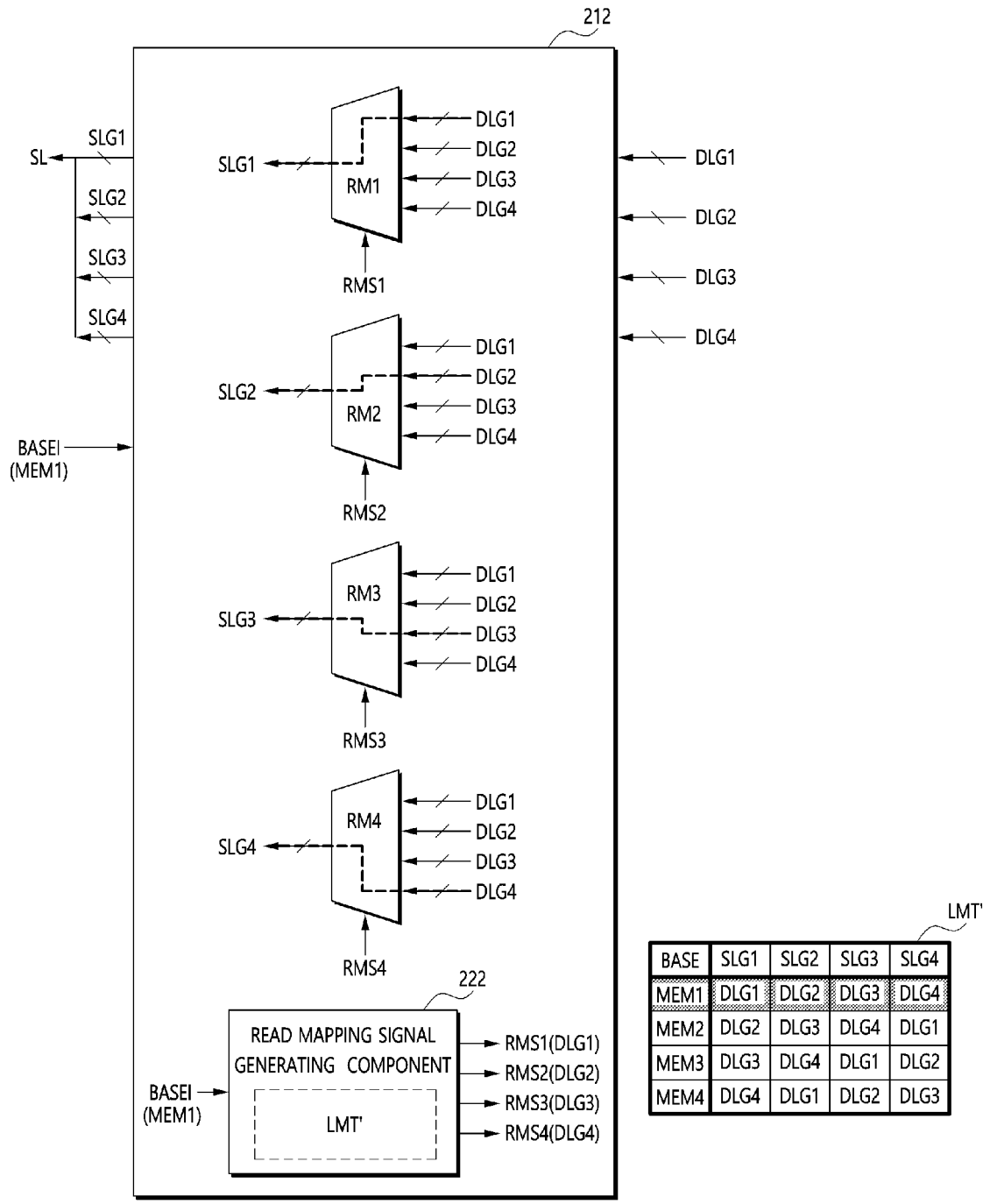
FIGS. 14 and 15 are diagrams illustrating a line mapping operation of the read data processing component of FIG. 13 according to an embodiment of the present disclosure.
Figure 15:
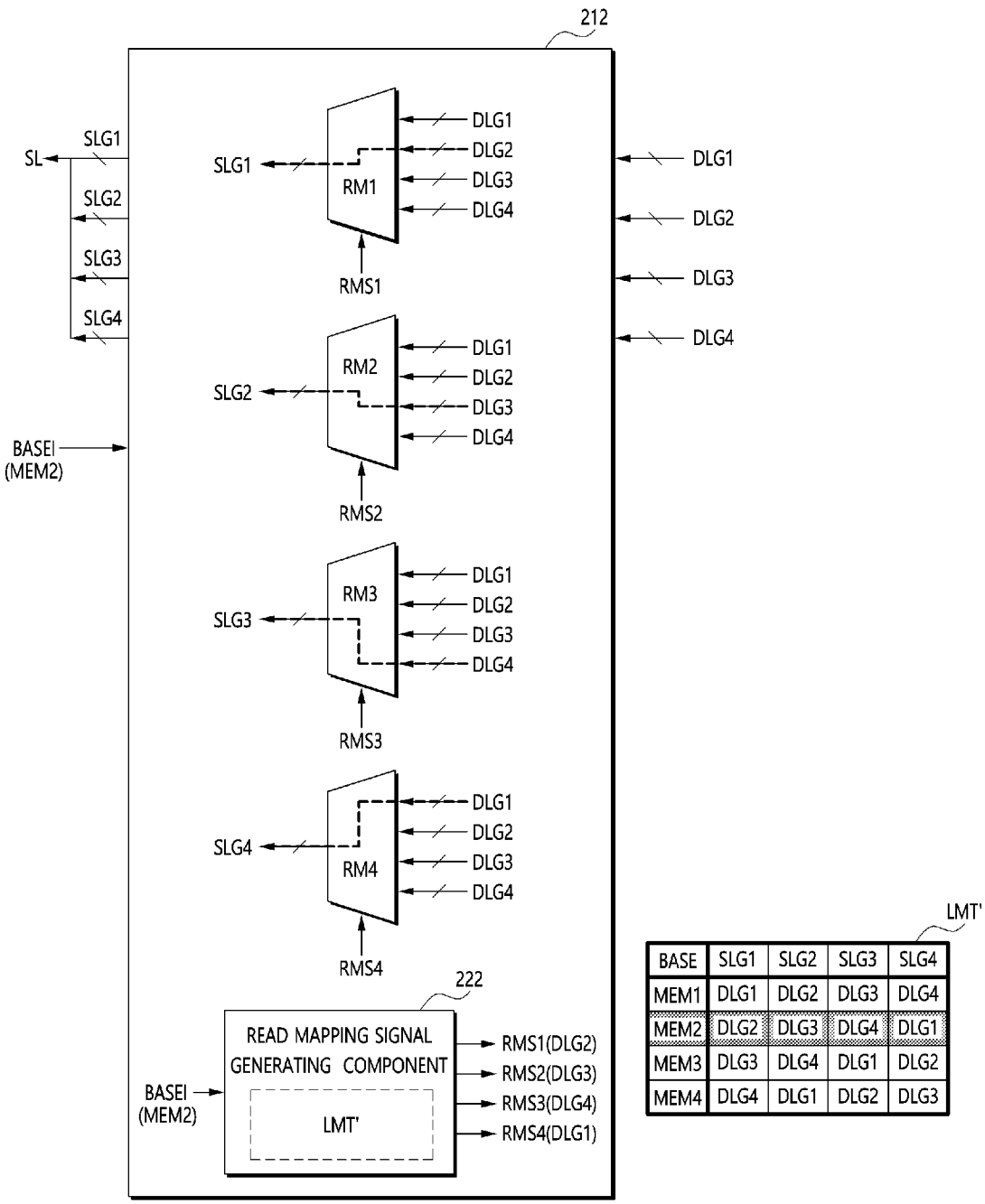

FIGS. 14 and 15 are diagrams illustrating a line mapping operation of the read data processing component 212 of FIG. 13 according to an embodiment of the present disclosure.

Referring to FIG. 14, the base device information BASEI may indicate the first memory device MEM1 as the base device BASE. In this case, the read data processing component 212 may operate as follows.

The read mapping signal generating component 222 may generate, in response to the base device information BASEI, the first to fourth read mapping signals RMS1 to RMS4 respectively indicating the first to fourth device line groups DLG1 to DLG4.

In response to the first read mapping signal RMS1, the first read multiplexer RM1 may transfer, to the first system line group SLG1, data from the first device line group DLG1 among the first to fourth device line groups DLG1 to DLG4.

In response to the second read mapping signal RMS2, the second read multiplexer RM2 may transfer, to the second system line group SLG2, data from the second device line group DLG2 among the first to fourth device line groups DLG1 to DLG4.

In response to the third read mapping signal RMS3, the third read multiplexer RM3 may transfer, to the third system line group SLG3, data from the third device line group DLG3 among the first to fourth device line groups DLG1 to DLG4.

In response to the fourth read mapping signal RMS4, the fourth read multiplexer RM4 may transfer, to the fourth system line group SLG4, data from the fourth device line group DLG4 among the first to fourth device line groups DLG1 to DLG4.

Referring to FIG. 15, the base device information BASEI may indicate the second memory device MEM2 as the base device BASE. In this case, the read data processing component 212 may operate as follows.

The read mapping signal generating component 222 may generate, in response to the base device information BASEI, the first to fourth read mapping signals RMS1 to RMS4 respectively indicating the second, third, fourth and first device line groups DLG2, DLG3, DLG4 and DLG1.

In response to the first read mapping signal RMS1, the first read multiplexer RM1 may transfer, to the first system line group SLG1, data from the second device line group DLG2 among the first to fourth device line groups DLG1 to DLG4.

In response to the second read mapping signal RMS2, the second read multiplexer RM2 may transfer, to the second system line group SLG2, data from the third device line group DLG3 among the first to fourth device line groups DLG1 to DLG4.

In response to the third read mapping signal RMS3, the third read multiplexer RM3 may transfer, to the third system line group SLG3, data from the fourth device line group DLG4 among the first to fourth device line groups DLG1 to DLG4.

In response to the fourth read mapping signal RMS4, the fourth read multiplexer RM4 may transfer, to the fourth system line group SLG4, data from the first device line group DLG1 among the first to fourth device line groups DLG1 to DLG4.

Figure 16:
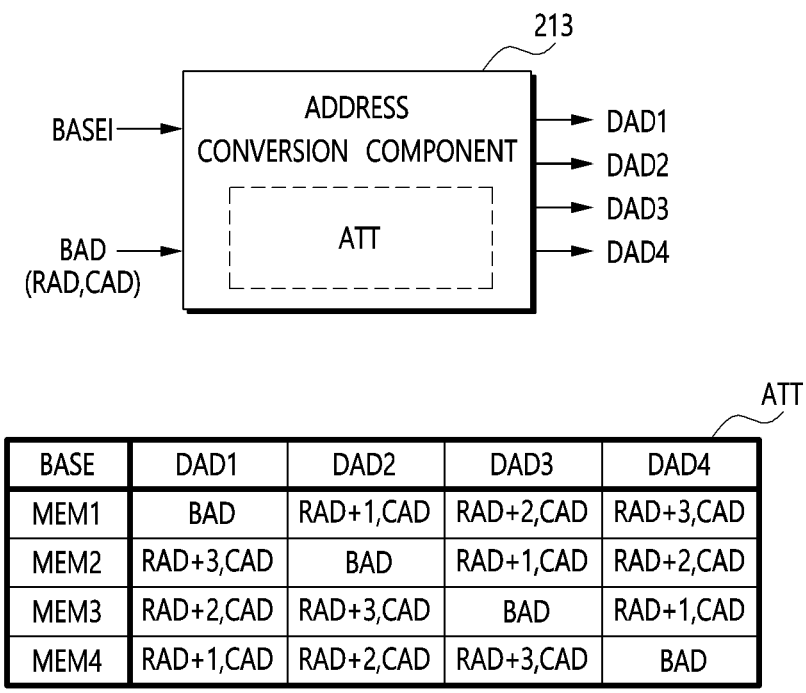
FIG. 16 is a block diagram illustrating an address conversion component of FIG. 9 according to an embodiment of the present disclosure.

FIG. 16 is a block diagram illustrating the address conversion component 213 of FIG. 9 according to an embodiment of the present disclosure.

For read operations of the respective first to fourth memory devices MEM1 to MEM4, the address conversion component 213 may convert, based on the base device information BASEI provided from the host device 20, a base address BAD into first to fourth device addresses DAD1 to DAD4 to be provided to the respective first to fourth memory devices MEM1 to MEM4. The base address BAD may include a row address RAD and a column address CAD provided together with a read command from the host device 20.

For example, the address conversion component 213 may generate the first to fourth device addresses DAD1 to DAD4 based on an address conversion table ATT. The address conversion table ATT may include the first to fourth device addresses DAD1 to DAD4, which are generated according to the base device BASE. As can be seen from the address conversion table ATT illustrated in FIG. 16, the device address of the base device BASE may be the base address BAD. Also, remaining ones of the first to fourth device addresses DAD1 to DAD4 may respectively include row addresses, which increase by respective amounts of 1, 2 and 3 from the row address RAD of the base address BAD, and the remaining ones of the first to fourth device addresses DAD1 to DAD4 may each include the column address CAD of the base address BAD.

More specifically, when the base device BASE is the first memory device MEM1, the address conversion component 213 may generate the first device address DAD1 that is the base address BAD. Also, the address conversion component 213 may generate row addresses, which increase by respective amounts of 1, 2 and 3 from the row address RAD of the base address BAD, as respective row addresses of the second, third and fourth device addresses DAD2, DAD3 and DAD4. When the base device BASE is the second memory device MEM2, the address conversion component 213 may generate the second device address DAD2 that is the base address BAD. Also, the address conversion component 213 may generate row addresses, which increase by respective amounts of 1, 2 and 3 from the row address RAD of the base address BAD, as respective row addresses of the third, fourth and first device addresses DAD3, DAD4 and DAD1. When the base device BASE is the third memory device MEM3, the address conversion component 213 may generate the third device address DAD3 that is the base address BAD. Also, the address conversion component 213 may generate row addresses, which increase by respective amounts of 1, 2 and 3 from the row address RAD of the base address BAD, as respective row addresses of the fourth, first and second device addresses DAD4, DAD1 and DAD2. When the base device BASE is the fourth memory device MEM4, the address conversion component 213 may generate the fourth device address DAD4 that is the base address BAD. Also, the address conversion component 213 may generate row addresses, which increase by respective amounts of 1, 2 and 3 from the row address RAD of the base address BAD, as respective row addresses of the first, second and third device addresses DAD1, DAD2 and DAD3.

In an embodiment, the address conversion component 213 may selectively operate under the control of the host device 20. For example, as described later, the address conversion component 213 may operate when the host device 20 requests a column read operation on the matrix.

Figure 17:
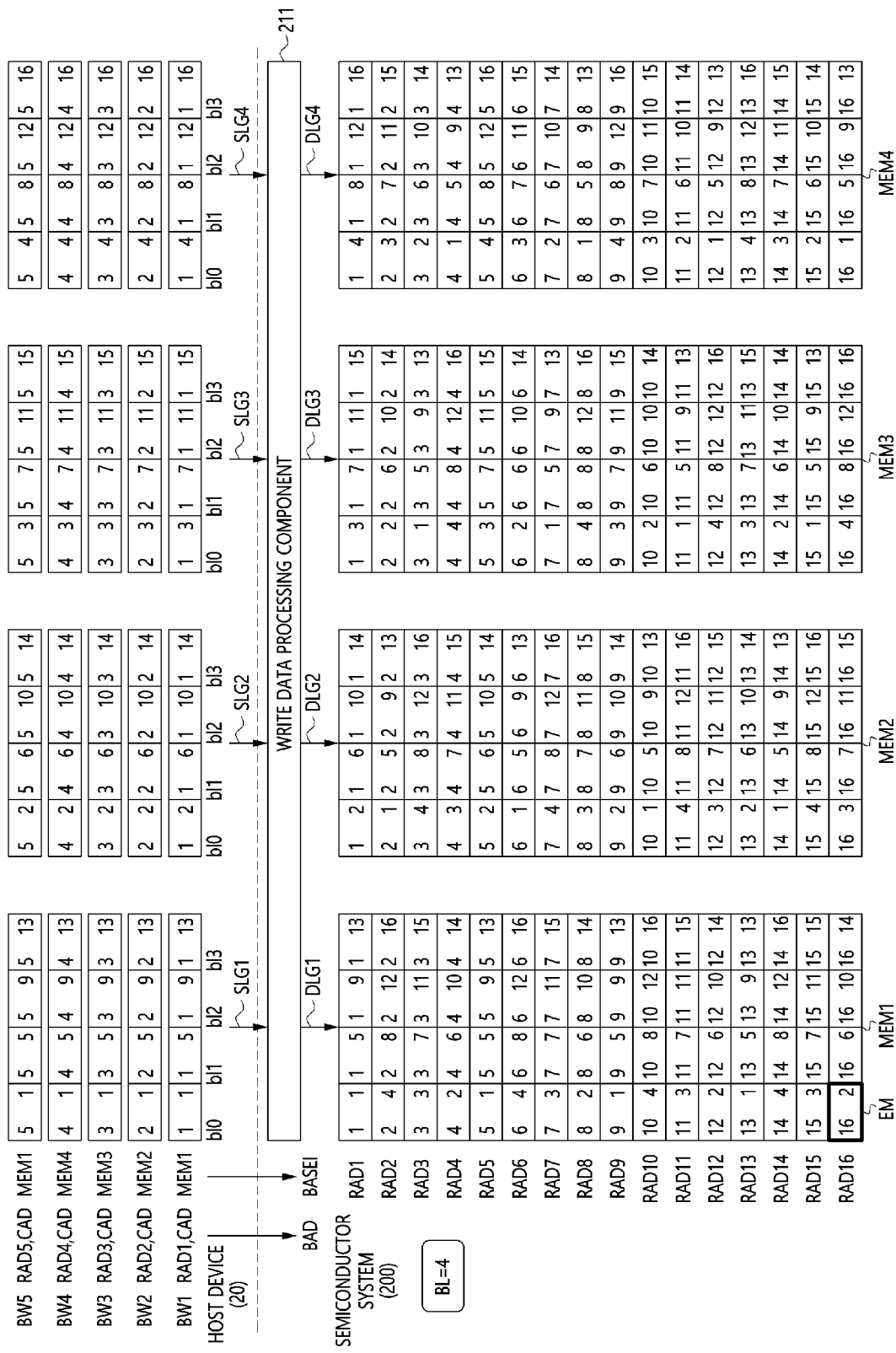
FIG. 17 is a diagram illustrating a process of storing a 16×16 matrix into the semiconductor system of FIG. 9 according to an embodiment of the present disclosure.

FIG. 17 is a diagram illustrating a process of storing a 16×16 matrix into the semiconductor system 200 of FIG. 9 according to an embodiment of the present disclosure. In FIG. 17, the first to fourth memory devices MEM1 to MEM4 do not operate according to the burst address gap BAG or do operate according to the burst address gap BAG of a value one (1), which is different from the memory device 120 of FIG. 1.

The precision degree of a matrix may be the same as a device input/output bit width of each memory device included in the semiconductor system 200. The precision degree of a matrix may be the same as each bit width of the first to fourth device line groups DLG1 to DLG4 and the first to fourth system line groups SLG1 to SLG4. Therefore, the host device 20 may provide each of the first to fourth system line groups SLG1 to SLG4 with four number of elements of a matrix, at a time. The host device 20 may provide the first to fourth system line groups SLG1 to SLG4 respectively with four data groups each having four number of elements of a matrix, simultaneously. The four data groups may correspond to the number of system line groups SLG1 to SLG4 and each of the four number of elements (i.e., four number of the data sets DQs) may correspond to the bit width of each of the number of device line groups DLG1 to DLG4. Also, the host device 20 may control the semiconductor system 200 to perform a burst write operation for the burst length BL, for example, of a value four (4). When four number of elements are simultaneously transferred through the system lines SL and the burst length BL is of a value four (4), the host device 20 may store a single row of a matrix into the semiconductor system 200 through a single burst write command. FIG. 17 illustrates four data groups each having four number of elements bl0, bl1, bl2 and bl3 and simultaneously transferred to the respective first to fourth system line groups SLG1 to SLG4 when the burst length BL is of a value four (4).

The host device 20 may provide the first to fourth system line groups SLG1 to SLG4 with elements of a matrix according to the row major scheme. More specifically, for the first burst write operation BW1, the host device 20 may provide the first to fourth system line groups SLG1 to SLG4 simultaneously with respective four data groups of elements of first to fourth columns of a first row of a matrix, elements of fifth to eighth columns of the first row, elements of ninth to twelfth columns of the first row and elements of thirteenth to sixteenth columns of the first row. As illustrated in FIG. 17, for the second to fifth burst write operations BW2 to BW5, the host device 20 may provide the first to fourth system line groups SLG1 to SLG4 with elements of second to fifth rows of the matrix in a similar way. The host device 20 may provide the first to fourth system line groups SLG1 to SLG4 with elements of remaining rows of the matrix in a similar way.

The host device 20 may provide the memory controller 210 with the base address BAD. Specifically, when providing the memory controller 210 with the respective first to sixteenth rows of the matrix, the host device 20 may provide the memory controller 210 with the respective first to sixteenth row addresses RAD1 to RAD16. For example, the host device 20 may provide the memory controller 210 with the first row address RAD1 when providing the memory controller 210 with the first row of the matrix and may provide the memory controller 210 with the second row address RAD2 when providing the memory controller 210 with the second row of the matrix. When providing the memory controller 210 with the respective first to sixteenth rows of the matrix, the host device 20 may provide the memory controller 210 with a start column address CAD.

Whenever providing the semiconductor system 200 with each row of the matrix, the host device 20 may determine the base device BASE and may provide the memory controller 210 with the base device information BASEI. Whenever providing the semiconductor system 200 sequentially with the rows starting from the first row of the matrix, the host device 20 may determine, as the base device BASE, the first to fourth memory devices MEM1 to MEM4 sequentially starting from the first memory device MEM1 according to the device order. For example, the base device BASE may be the first memory device MEM1 when the first row is provided to the memory controller 210, may be the second memory device MEM2 when the second row is provided to the memory controller 210, may be the third memory device MEM3 when the third row is provided to the memory controller 210 and may be the fourth memory device MEM4 when the fourth row is provided to the memory controller 210. In this case, the base device BASE may be the first memory device MEM1 again when the fifth row is provided to the memory controller 210.

Based on the base address BAD and the base device information BASEI provided from the host device 20, the memory controller 210 may control the first to fourth memory devices MEM1 to MEM4 respectively to perform the burst write operations for the burst length BL of a value four (4).

Specifically, when the first row of the matrix is provided from the host device 20, the base device BASE may be the first memory device MEM1 and the write data processing component 211 may transfer elements from the first to fourth system line groups SLG1 to SLG4 to the first to fourth device line groups DLG1 to DLG4, respectively, through the line mapping operation. Therefore, the first to fourth memory devices MEM1 to MEM4 may store the elements, which are transferred from the first to fourth system line groups SLG1 to SLG4, into pages corresponding to the first row address RAD1, respectively, through the first burst write operation BW1.

When the second row of the matrix is provided from the host device 20, the base device BASE may be the second memory device MEM2 and the write data processing component 211 may transfer elements from the first to fourth system line groups SLG1 to SLG4 to the second, third, fourth and first device line groups DLG2, DLG3, DLG4 and DLG1, respectively, through the line mapping operation. Therefore, the second, third, fourth and first memory devices MEM2, MEM3, MEM4 and MEM1 may store the elements, which are transferred from the first to fourth system line groups SLG1 to SLG4, into pages corresponding to the second row address RAD2, respectively, through the second burst write operation BW2.

When the third row of the matrix is provided from the host device 20, the base device BASE may be the third memory device MEM3 and the write data processing component 211 may transfer elements from the first to fourth system line groups SLG1 to SLG4 to the third, fourth, first and second device line groups DLG3, DLG4, DLG1 and DLG2, respectively, through the line mapping operation. Therefore, the third, fourth, first and second memory devices MEM3, MEM4, MEM1 and MEM2 may store the elements, which are transferred from the first to fourth system line groups SLG1 to SLG4, into pages corresponding to the third row address RAD3, respectively, through the third burst write operation BW3.

When the fourth row of the matrix is provided from the host device 20, the base device BASE may be the fourth memory device MEM4 and the write data processing component 211 may transfer elements from the first to fourth system line groups SLG1 to SLG4 to the fourth, first, second and third device line groups DLG4, DLG1, DLG2, DLG3, respectively, through the line mapping operation. Therefore, the fourth, first, second and third memory devices MEM4, MEM1, MEM2, MEM3 may store the elements, which are transferred from the first to fourth system line groups SLG1 to SLG4, into pages corresponding to the fourth row address RAD4, respectively, through the fourth burst write operation BW4.

In a similar way to the first row of the matrix, the fifth row of the matrix may be stored in the semiconductor system 200 through the fifth burst write operation BW5. Remaining rows of the matrix may be stored in the semiconductor system 200 in a similar way.

In an embodiment, determined according to following equation 2 may be a number indicating a memory device to store therein a (i, j)th element of a matrix, and determined according to following equation 3 may be an address of a memory region in which the (i, j)th element of the matrix is stored within the memory device determined according to equation 2.

Number indicating a memory device to store therein a $(i,j)$th element of a matrix $= [(i-1)\text{Mcol}+j-1+ \text{RoundDown}(((i-1)*\text{Mcol}+j-1)/ (bl*\text{ChipNum}))]\% \text{ChipNum}$     [Equation 2]

Address of a memory region in which the $(i,j)$th element of the matrix is stored $= \text{Baddr}+(i-1) *\text{RoundUp}(\text{Mcol}/bl)+\text{RoundDown}((j-1-(j-1)\%bl)/bl)$     [Equation 3]

In equations 2 and 3, the number indicating a memory device to store therein the (i, j)th element may represent a number corresponding to the device order. "Baddr" may represent an address of a memory region in which a (1, 1)th element of the matrix is stored. "Mcol" may represent a number of columns of the matrix. "bl" may represent the burst length BL. "RoundUp( )" may represent a round-up function. "RoundDown( )" may represent a round-down function. "ChipNum" may represent a number of the memory devices MEM1 to MEM4.

In an embodiment, the base device information BASEI of a burst write operation, which is provided from the host device 20 in order to store each row of the matrix, may indicate a memory device determined according to equation 2 to store therein an initial element of the row. In an embodiment, the row address for the burst write operation, which is provided from the host device 20 in order to store each row of the matrix, may be a row address of an initial element of the row of the matrix determined according to equation 3. In an embodiment, the start column address for the burst write operation, which is provided from the host device 20 in order to store each row of the matrix, may be a column address of the initial element of the row of the matrix determined according to equation 3. The initial element of each row of the matrix may be an element of a first column of the row of the matrix.

Figure 18:
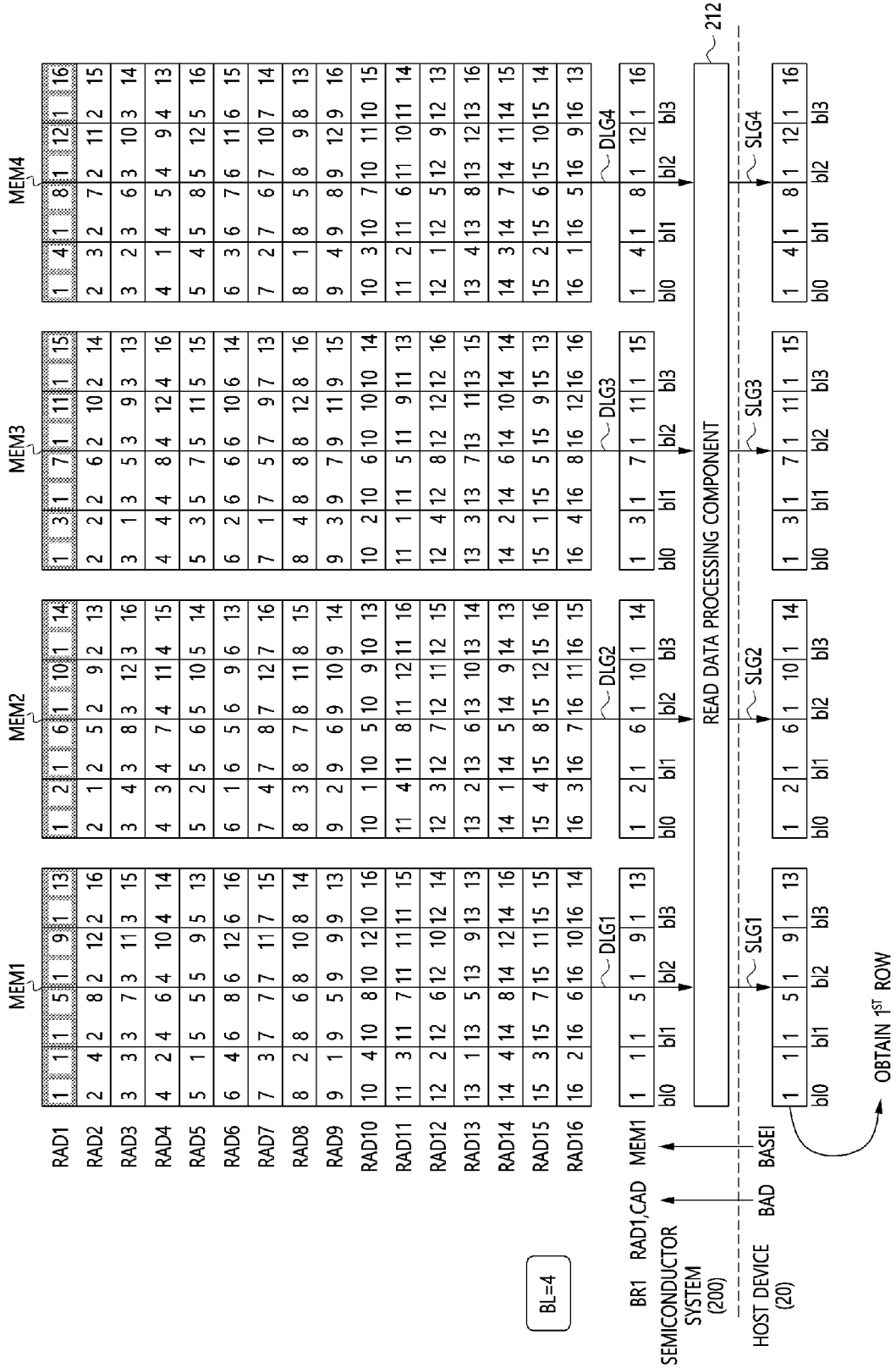
FIGS. 18 and 19 are diagrams illustrating a process of obtaining rows of the matrix from the semiconductor system of FIG. 9 according to an embodiment of the present disclosure.
Figure 19:
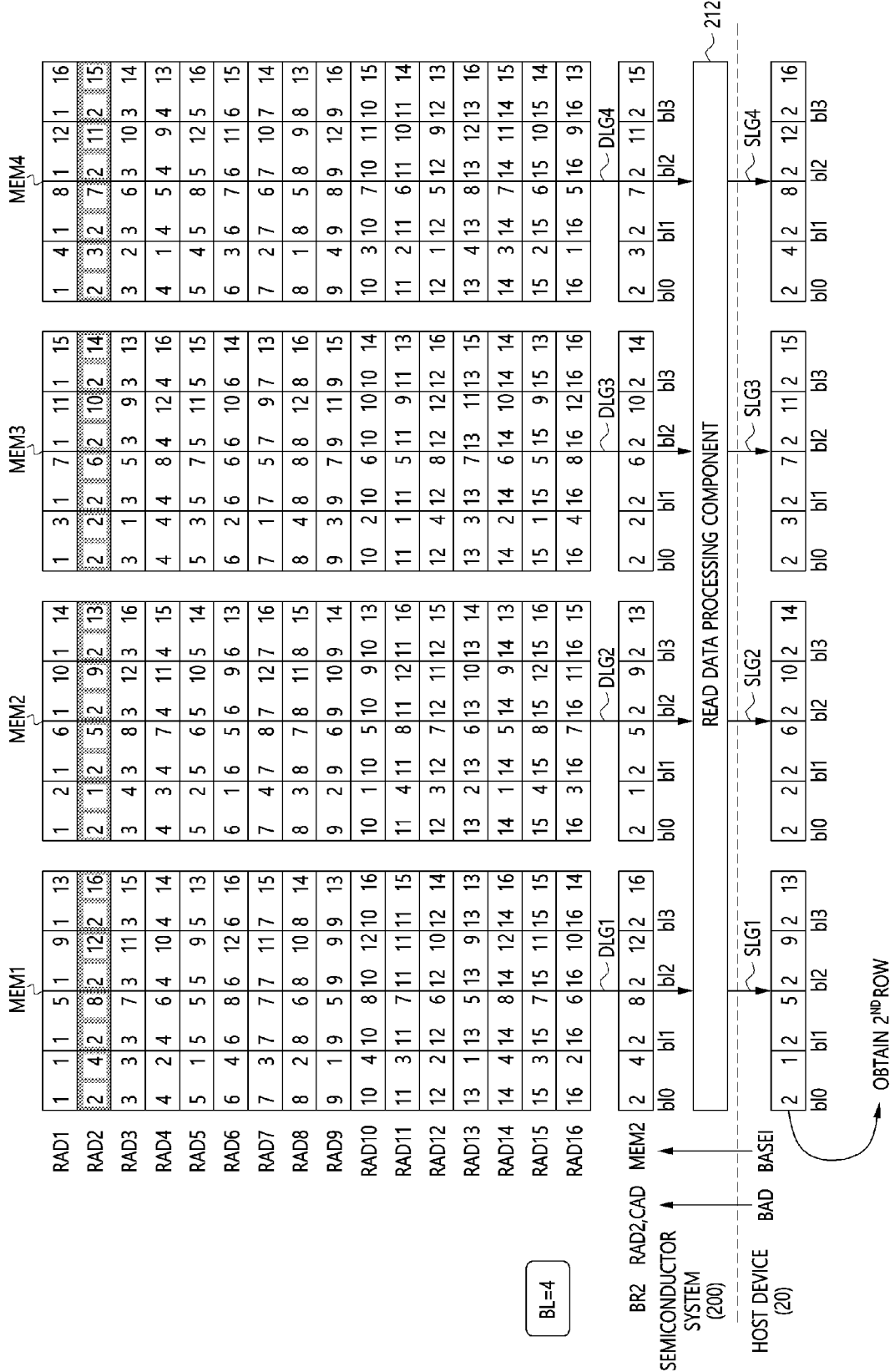

FIGS. 18 and 19 are diagrams illustrating a process of obtaining rows of the matrix from the semiconductor system 200 of FIG. 9 according to an embodiment of the present disclosure. Referring to FIGS. 18 and 19, the matrix is stored in the semiconductor system 200 in the way described with reference to FIG. 17. Also, the first to fourth memory devices MEM1 to MEM4 do not operate according to the burst address gap BAG or do operate according to the burst address gap BAG of a value one (1), which is different from the memory device 120 of FIG. 1.

When the original matrix is required, the host device 20 may perform a row read operation. When reading each row of the matrix from the semiconductor system 200, the host device 20 may utilize the same row address as utilized when storing the row into the semiconductor system 200. That is, since the first to sixteenth rows of the matrix are stored respectively in pages of the first to sixteenth row addresses RAD1 to RAD16, the host device 20 may provide, as a part of the base address BAD, the memory controller 210 with an i-th row address in order to read the i-th row of the stored matrix. The host device 20 may provide, as remaining part of the base address BAD, the memory controller 210 with the same start column address CAD as utilized when storing the matrix into the semiconductor system 200.

Whenever reading each row from the semiconductor system 200, the host device 20 may determine the base device BASE and provide the memory controller 210 with the base device information BASEI. When reading each row of the matrix from the semiconductor system 200, the host device 20 may provide the semiconductor system 200 with the same base device information BASEI as provided to the semiconductor system 200 when storing the row into the semiconductor system 200.

Specifically, whenever sequentially reading the rows starting from the first row of the matrix, the host device 20 may determine, as the base device BASE, the first to fourth memory devices MEM1 to MEM4 sequentially starting from the first memory device MEM1 according to the device order. For example, the base device BASE may be the first memory device MEM1 when the first row is to be read, may be the second memory device MEM2 when the second row is to be read, may be the third memory device MEM3 when the third row is to be read and may be the fourth memory device MEM4 when the fourth row is to be read. In this case, the base device BASE may be the first memory device MEM1 again when the fifth row is to be read.

Referring to FIG. 18, the host device 20 may read the first row of the matrix from the semiconductor system 200 through the first burst read operation BR1 of the burst length BL of a value four (4). For the first burst read operation BR1, the host device 20 may provide the memory controller 210 with the base address BAD including the first row address RAD1 and the start column address CAD. Also, the host device 20 may provide the memory controller 210 with the base device information BASEI indicating the first memory device MEM1 as the base device BASE.

Under the control of the memory controller 210, the first to fourth memory devices MEM1 to MEM4 may perform, in a parallel way, the first burst read operations BR1 of the burst length BL of a value four (4) on the first row address RAD1 and the start column address CAD. FIG. 18 illustrates four data groups each having four number of elements bl0, bl1, bl2 and bl3 and simultaneously output from the respective first to fourth memory devices MEM1 to MEM4 when the burst length BL is of a value four (4).

At this time, since the base device BASE is the first memory device MEM1, the read data processing component 212 may transfer the elements from the first to fourth device line groups DLG1 to DLG4 to the first to fourth system line groups SLG1 to SLG4, respectively, through the line mapping operation. Therefore, the host device 20 may obtain the first row of the matrix.

Referring to FIG. 19, the host device 20 may read the second row of the matrix from the semiconductor system 200 through the second burst read operation BR2 of the burst length BL of a value four (4). For the second burst read operation BR2, the host device 20 may provide the memory controller 210 with the base address BAD including the second row address RAD2 and the start column address CAD. Also, the host device 20 may provide the memory controller 210 with the base device information BASEI indicating the second memory device MEM2 as the base device BASE.

Under the control of the memory controller 210, the first to fourth memory devices MEM1 to MEM4 may perform, in a parallel way, the second burst read operations BR2 of the burst length BL of a value four (4) on the second row address RAD2 and the start column address CAD.

Since the base device BASE is the second memory device MEM2, the read data processing component 212 may transfer the elements from the first to fourth device line groups DLG1 to DLG4 to the fourth, first, second and third system line groups SLG4, SLG1, SLG2 and SLG3, respectively, through the line mapping operation. Therefore, the host device 20 may obtain the second row of the matrix.

In the same way as described above, the host device 20 may obtain remaining rows of the matrix to obtain the original matrix.

In an embodiment, the base device information BASEI of a burst read operation, which is provided from the host device 20 in order to read each row of the matrix, may indicate a memory device determined according to equation 2 and storing an initial element of the row. In an embodiment, the row address for the burst read operation, which is provided from the host device 20 in order to read each row of the matrix, may be a row address of an initial element of the row of the matrix determined according to equation 3. In an embodiment, the start column address for the burst read operation, which is provided from the host device 20 in order to read each row of the matrix, may be a column address of the initial element of the row of the matrix determined according to equation 3. The initial element of each row of the matrix may be an element of a first column of the row of the matrix.

Figure 20:
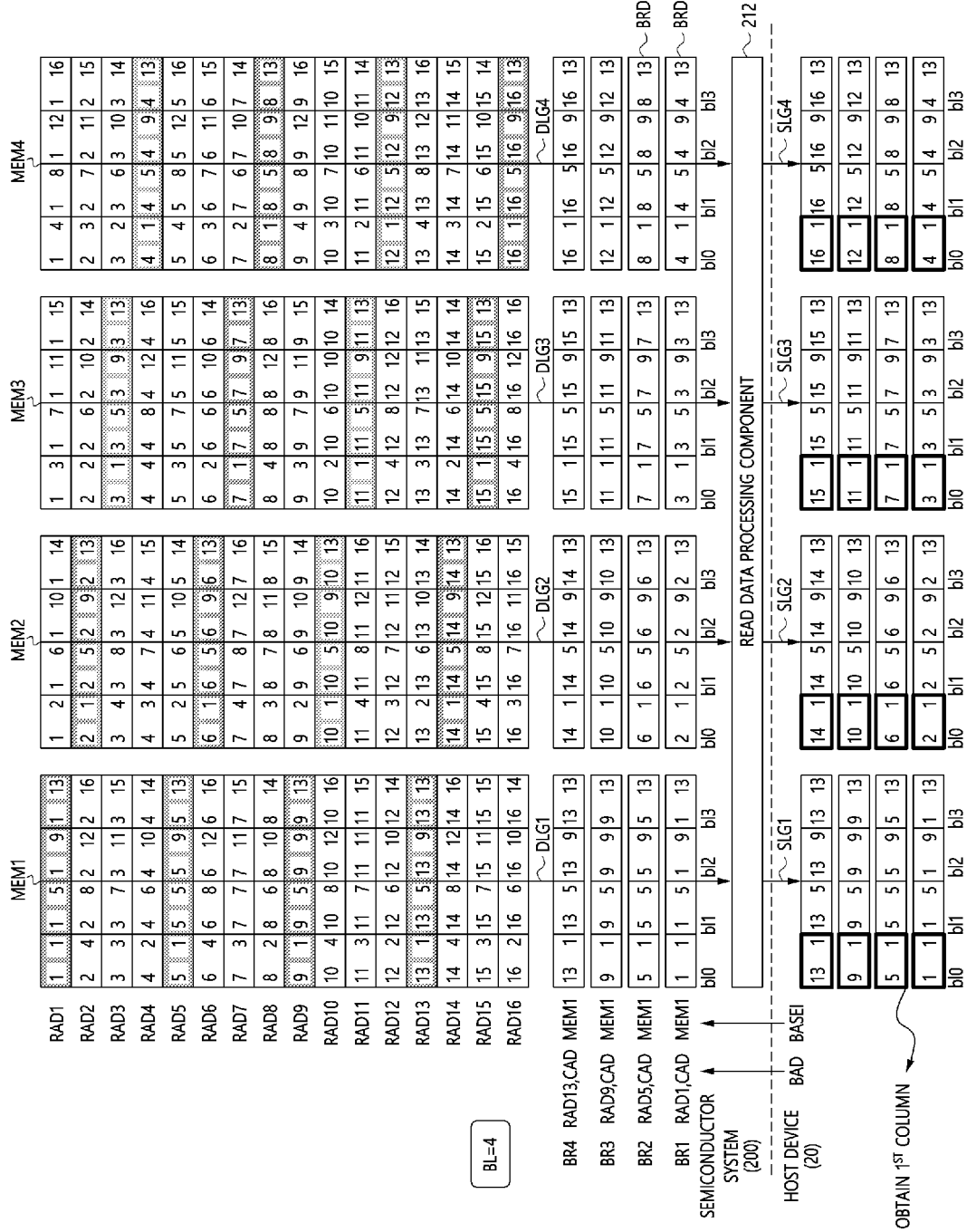
FIGS. 20 and 21 are diagrams illustrating a process of obtaining columns of the matrix from the semiconductor system of FIG. 9 according to an embodiment of the present disclosure.
Figure 21:
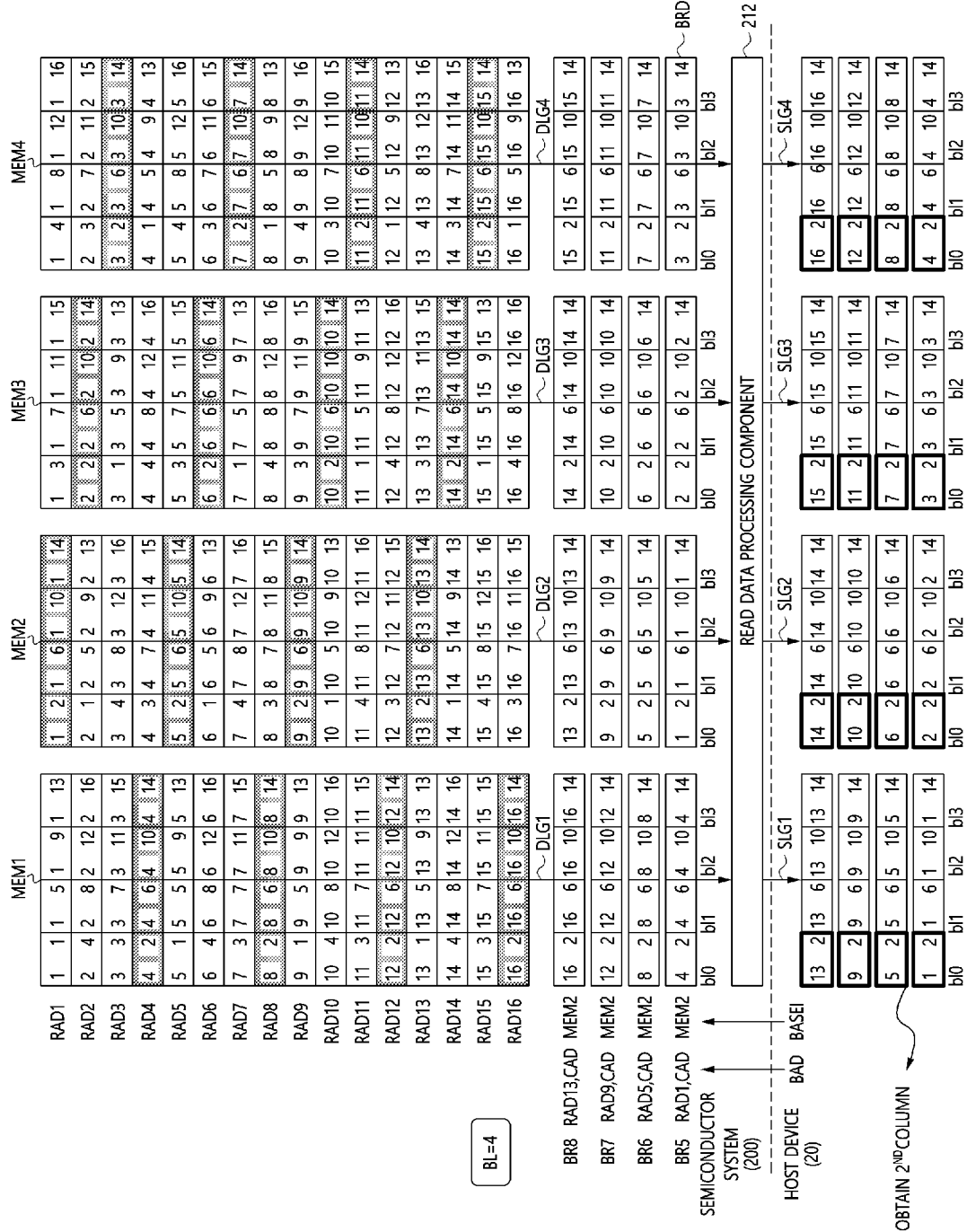

FIGS. 20 and 21 are diagrams illustrating a process of obtaining columns of the matrix from the semiconductor system 200 of FIG. 9 according to an embodiment of the present disclosure. Referring to FIGS. 20 and 21, the matrix is stored in the semiconductor system 200 in the way described with reference to FIG. 17. Also, the first to fourth memory devices MEM1 to MEM4 do not operate according to the burst address gap BAG or do operate according to the burst address gap BAG of a value one (1), which is different from the memory device 120 of FIG. 1.

When the transposed matrix is required, the host device 20 may perform a column read operation.

Through four number of the burst read operations of the burst length BL of a value four (4), the host device 20 may read a set of columns (hereinafter, referred to as a column set) comprising four number of columns of the matrix from the semiconductor system 200. For example, a first column set may comprise first, fifth, ninth and thirteenth columns of the matrix (which will be described with reference to FIG. 20) and a second column set may comprise second, sixth, tenth and fourteenth columns of the matrix (which will be described with reference to FIG. 21). Also, a third column set may comprise third, seventh, eleventh and fifteenth columns of the matrix and a fourth column set may comprise fourth, eighth, twelfth and sixteenth columns of the matrix, although not illustrated.

A number of the burst read operations that each memory device is to perform in order to read each column set of the matrix may be a value obtained by dividing a total number of rows of the matrix by a number of the memory devices MEM1 to MEM4 included in the semiconductor system 200. In an example of FIG. 20, four (4) is the number of the burst read operations that each memory device is to perform in order to read each column set.

Whenever reading each column set of the matrix from the semiconductor system 200, the host device 20 may provide the memory controller 210 with row addresses starting from the first row address RAD1 and having a numerical difference between adjacent ones by an amount of the total number of the memory devices (e.g., four (4) in the example of FIG. 20). For example, whenever reading each column set from the semiconductor system 200, the host device 20 may provide the memory controller 210 with first, fifth, ninth and thirteenth row addresses RAD1, RAD5, RAD9 and RAD13. When reading a subsequent column set from the semiconductor system 200, the host device 20 may provide the memory controller 210 with the same first, fifth, ninth and thirteenth row addresses RAD1, RAD5, RAD9 and RAD13. The host device 20 may provide the memory controller 210 with the same start column address CAD as utilized when storing the matrix into the semiconductor system 200.

Whenever reading each column set of the matrix from the semiconductor system 200, the host device 20 may determine the base device BASE and provide the memory controller 210 with the base device information BASEI. Specifically, whenever sequentially reading the column sets starting from a first column set of the matrix, the host device 20 may determine, as the base device BASE, the first to fourth memory devices MEM1 to MEM4 sequentially starting from the first memory device MEM1 according to the device order. For example, the base device BASE may be the first memory device MEM1 when a first column set is to be read, may be the second memory device MEM2 when a second column set is to be read, may be the third memory device MEM3 when a third column set is to be read and may be the fourth memory device MEM4 when a fourth column set is to be read.

During the column read operation, the host device 20 may control the address conversion component 213 of the memory controller 210 to operate.

Referring to FIG. 20, the host device 20 may read, from the semiconductor system 200, the first column set including first, fifth, ninth and thirteenth columns of the matrix through the first to fourth burst read operations BR1 to BR4.

For the first burst read operation BR1 of the burst length BL of a value four (4), the host device 20 may provide the memory controller 210 with the base address BAD including the first row address RAD1 and the start column address CAD. Also, the host device 20 may provide the memory controller 210 with the base device information BASEI indicating the first memory device MEM1 as the base device BASE.

During the column read operation, the address conversion component 213 may operate under the control of the host device 20, which is different from the row read operation. Since the base device BASE is the first memory device MEM1, the address conversion component 213 may generate the first device address DAD1, which is to be provided to the first memory device MEM1, by converting the base address BAD provided from the host device 20. Also, the address conversion component 213 may generate addresses that increase by respective amounts of 1, 2 and 3 from the row address of the base address BAD, i.e., from the first row address RAD1, as the second to fourth device addresses DAD2 to DAD4, which are to be provided respectively to the second to fourth memory devices MEM2 to MEM4.

Therefore, the first memory device MEM1 may perform the first burst read operation BR1 of the burst length BL of a value four (4) on the first row address RAD1, the second memory device MEM2 may perform the first burst read operation BR1 of the burst length BL of a value four (4) on the second row address RAD2, the third memory device MEM3 may perform the first burst read operation BR1 of the burst length BL of a value four (4) on the third row address RAD3 and the fourth memory device MEM4 may perform the first burst read operation BR1 of the burst length BL of a value four (4) on the fourth row address RAD4. The first to fourth memory devices MEM1 to MEM4 may perform the first burst read operations BR1 in parallel.

Since the base device BASE is the first memory device MEM1, the read data processing component 212 may transfer the elements BRD1 from the first to fourth device line groups DLG1 to DLG4 to the first to fourth system line groups SLG1 to SLG4, respectively, through the line mapping operation.

For the second burst read operation BR2 of the burst length BL of a value four (4), the host device 20 may provide the memory controller 210 with the base address BAD including the fifth row address RAD5 and the start column address CAD. Also, the host device 20 may provide the memory controller 210 with the base device information BASEI indicating the first memory device MEM1 as the base device BASE.

Since the base device BASE is the first memory device MEM1, the address conversion component 213 may generate the first device address DAD1, which is to be provided to the first memory device MEM1, by converting the base address BAD provided from the host device 20. Also, the address conversion component 213 may generate addresses that increase by respective amounts of 1, 2 and 3 from the row address of the base address BAD, i.e., from the fifth row address RAD5, as the second to fourth device addresses DAD2 to DAD4, which are to be provided respectively to the second to fourth memory devices MEM2 to MEM4.

Therefore, the first memory device MEM1 may perform the second burst read operation BR2 of the burst length BL of a value four (4) on the fifth row address RAD5, the second memory device MEM2 may perform the second burst read operation BR2 of the burst length BL of a value four (4) on the sixth row address RAD6, the third memory device MEM3 may perform the second burst read operation BR2 of the burst length BL of a value four (4) on the seventh row address RAD7 and the fourth memory device MEM4 may perform the second burst read operation BR2 of the burst length BL of a value four (4) on the eighth row address RAD8. The first to fourth memory devices MEM1 to MEM4 may perform the second burst read operations BR2 in parallel.

Since the base device BASE is the first memory device MEM1, the read data processing component 212 may transfer the elements BRD2 from the first to fourth device line groups DLG1 to DLG4 to the first to fourth system line groups SLG1 to SLG4, respectively, through the line mapping operation.

In a similar way, the host device 20 and the semiconductor system 200 may perform the third and fourth burst read operations BR3 and BR4 on the ninth and thirteenth row addresses RAD9 and RAD13. Therefore, the host device 20 may obtain the first column set including the first, fifth, ninth and thirteenth columns of the matrix. Within the first column set, the host device 20 may first utilize the first column and may keep the remaining fifth, ninth and thirteenth columns in a separate memory.

Referring to FIG. 21, the host device 20 may read, from the semiconductor system 200, the second column set including second, sixth, tenth and fourteenth columns of the matrix through the fifth to eighth burst read operations BR5 to BR8.

For the fifth burst read operation BR5 of the burst length BL of a value four (4), the host device 20 may provide the memory controller 210 with the base address BAD including the first row address RAD1 and the start column address CAD. Also, the host device 20 may provide the memory controller 210 with the base device information BASEI indicating the second memory device MEM2 as the base device BASE.

Since the base device BASE is the second memory device MEM2, the address conversion component 213 may generate the second device address DAD2, which is to be provided to the second memory device MEM2, by converting the base address BAD provided from the host device 20. Also, the address conversion component 213 may generate addresses that increase by respective amounts of 1, 2 and 3 from the row address of the base address BAD, i.e., from the first row address RAD1, as the third, fourth and first device address DAD3, DAD4 and DAD1, which are to be provided respectively to the third, fourth and first memory device MEM3, MEM4 and MEM1.

Therefore, the second memory device MEM2 may perform the fifth burst read operation BR5 of the burst length BL of a value four (4) on the first row address RAD1, the third memory device MEM3 may perform the fifth burst read operation BR5 of the burst length BL of a value four (4) on the second row address RAD2, the fourth memory device MEM4 may perform the fifth burst read operation BR5 of the burst length BL of a value four (4) on the third row address RAD3 and the first memory device MEM1 may perform the fifth burst read operation BR5 of the burst length BL of a value four (4) on the fourth row address RAD4. The first to fourth memory devices MEM1 to MEM4 may perform the fifth burst read operations BR5 in parallel.

Since the base device BASE is the second memory device MEM2, the read data processing component 212 may transfer the elements BRD5 from the first to fourth device line groups DLG1 to DLG4 to the fourth, first, second and third system line groups SLG4, SLG1, SLG2, SLG3, respectively, through the line mapping operation.

In a similar way, the host device 20 and the semiconductor system 200 may perform the sixth to eighth burst read operations BR6 to BR8 on the fifth, ninth and thirteenth row addresses RAD5, RAD9 and RAD13. Therefore, the host device 20 may obtain the second column set including the second, sixth, tenth and fourteenth columns of the matrix. Within the second column set, the host device 20 may first utilize the second column and may keep the remaining sixth, tenth and fourteenth columns in a separate memory.

In an embodiment, a number of the burst read operations that each memory device is to perform in order to read each column set of the matrix may be a value obtained by dividing a total number of rows of the matrix by a number of the memory devices MEM1 to MEM4 included in the semiconductor system 200. In an embodiment, the base device information BASEI of a burst read operation, which is provided from the host device 20 in order to read each column set of the matrix, may indicate a memory device determined according to equation 2 and storing an initial element of the column set. In an embodiment, the row addresses for the burst read operations, which are provided from the host device 20 in order to read each column set of the matrix, may be row addresses that start from a row address of an initial element of the column set determined according to equation 3 and have a numerical difference between adjacent ones by an amount of the burst length BL. In an embodiment, the start column address for the burst read operations, which are provided from the host device 20 in order to read each column set of the matrix, may be a column address of the initial element of the column set determined according to equation 3. The initial element of each column set may be an element of a first row of a column in the forefront among columns included in the column set.

To sum up, the semiconductor system 200 may include a plurality of memory devices each having the device input/output bit width, which is the same as the precision degree of the matrix and may store therein the matrix in the process described above, such that the row read operation and the column read operation may be efficiently performed.

When storing the matrix in FIG. 17, the first to fourth memory devices MEM1 to MEM4 do not operate according to the burst address gap BAG or do operate according to the burst address gap BAG of a value one (1). Hereinafter, when storing the matrix, the first to fourth memory devices MEM1 to MEM4 operate according to the burst address gap BAG of the same value as the burst length BL, which is the same as the memory device 120 of FIG. 1.

Figure 22:
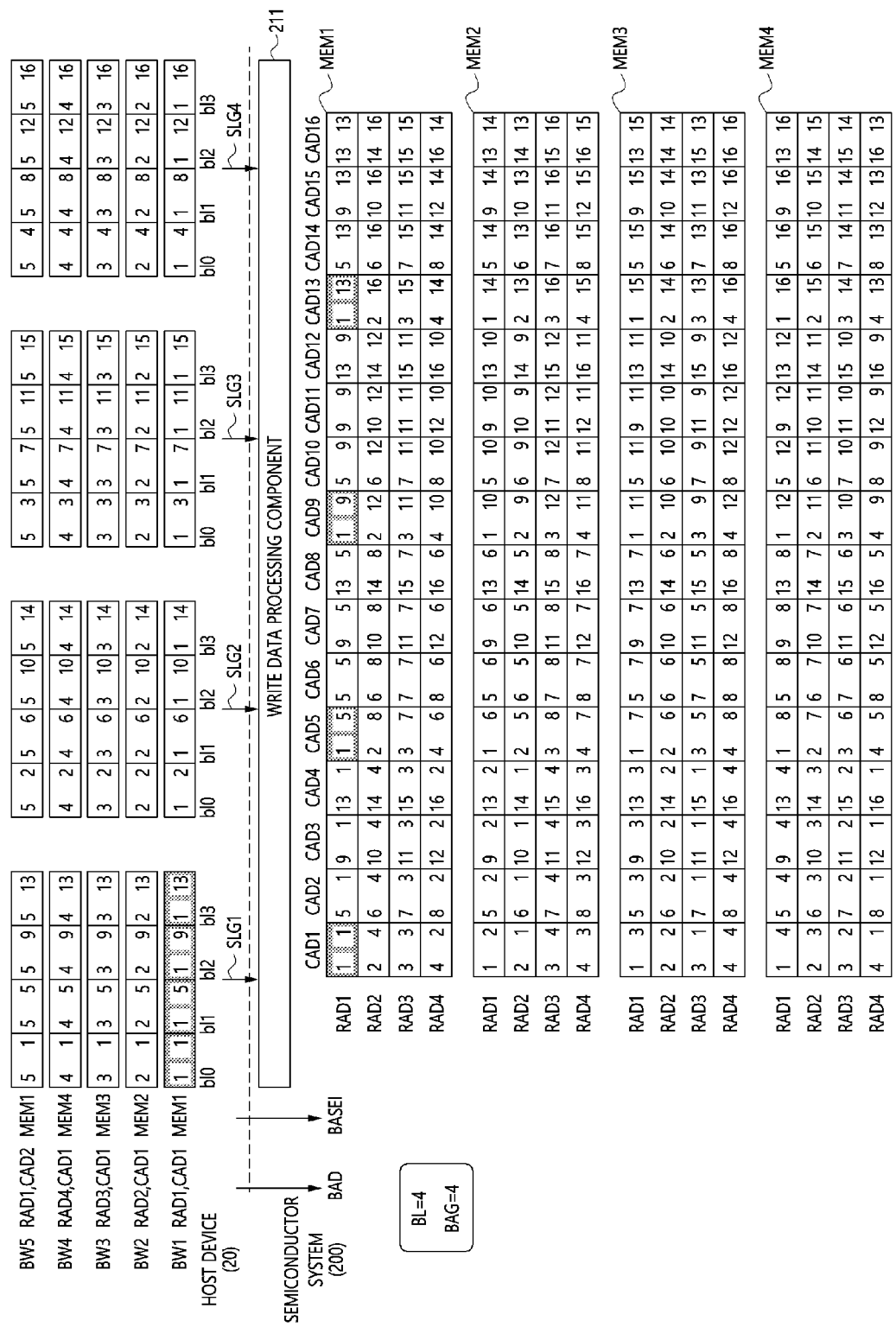
FIG. 22 is a diagram illustrating a process of storing a 16×16 matrix into the semiconductor system of FIG. 9 according to an embodiment of the present disclosure.

FIG. 22 is a diagram illustrating a process of storing a 16×16 matrix into the semiconductor system 200 of FIG. 9 according to an embodiment of the present disclosure. Each of the first to fourth memory devices MEM1 to MEM4 may support the burst address gap BAG.

In order to store the matrix, the host device 20 may control the semiconductor system 200 to perform a burst write operation of the burst address gap BAG of the same value as the burst length BL, for example, a value of four (4).

The host device 20 may provide the semiconductor system 200 with the elements of the matrix through the first to fourth system line groups SLG1 to SLG4, which is similar to the process described with reference to FIG. 17.

When providing the rows starting from the first row of the matrix, the host device 20 may provide the row addresses from the first row address RAD1 to the fourth row address RAD4. For example, the host device 20 may provide the memory controller 210 with the first row address RAD1 when providing the memory controller 210 with the first row of the matrix, may provide the memory controller 210 with the second row address RAD2 when providing the memory controller 210 with the second row of the matrix, may provide the memory controller 210 with the third row address RAD3 when providing the memory controller 210 with the third row of the matrix and may provide the memory controller 210 with the fourth row address RAD4 when providing the memory controller 210 with the fourth row of the matrix. In this case, the host device 20 may provide the memory controller 210 with the first row address RAD1 again when providing the memory controller 210 with the fifth row of the matrix. A number of the repetitive row addresses (e.g., the first to fourth row addresses RAD1 to RAD4) may be the same as the number of memory devices MEM1 to MEM4 included in the semiconductor system 200. Also, in order to store the first to fourth rows of the matrix into the semiconductor system 200, the host device 20 may provide the memory controller 210 with the same start column address CAD1. Further, in order to store the fifth to eighth rows of the matrix into the semiconductor system 200, the host device 20 may provide, as the start column address for the fifth to eighth rows, the memory controller 210 with a column address CAD2 subsequent to the column address CAD1, which is the start column address for the first to fourth rows. That is, the start column address may shift whenever the first to fourth row addresses RAD1 to RAD4 are repeated.

Whenever providing the semiconductor system 200 with each row of the matrix, the host device 20 may determine the base device BASE and may provide the memory controller 210 with the base device information BASEI, which is the same as described with reference to FIG. 17. Whenever providing the semiconductor system 200 sequentially with the rows starting from the first row of the matrix, the host device 20 may determine, as the base device BASE, the first to fourth memory devices MEM1 to MEM4 sequentially starting from the first memory device MEM1 according to the device order.

Based on the base address BAD and the base device information BASEI provided from the host device 20, the memory controller 210 may control the first to fourth memory devices MEM1 to MEM4 respectively to perform the burst write operations for the burst length BL of a value four (4) and the burst address gap BAG of a value four (4). As a result, the matrix may be stored in the semiconductor system 200 as illustrated in FIG. 22. Details of the process may be the same as described above and thus will be omitted.

Figure 23:
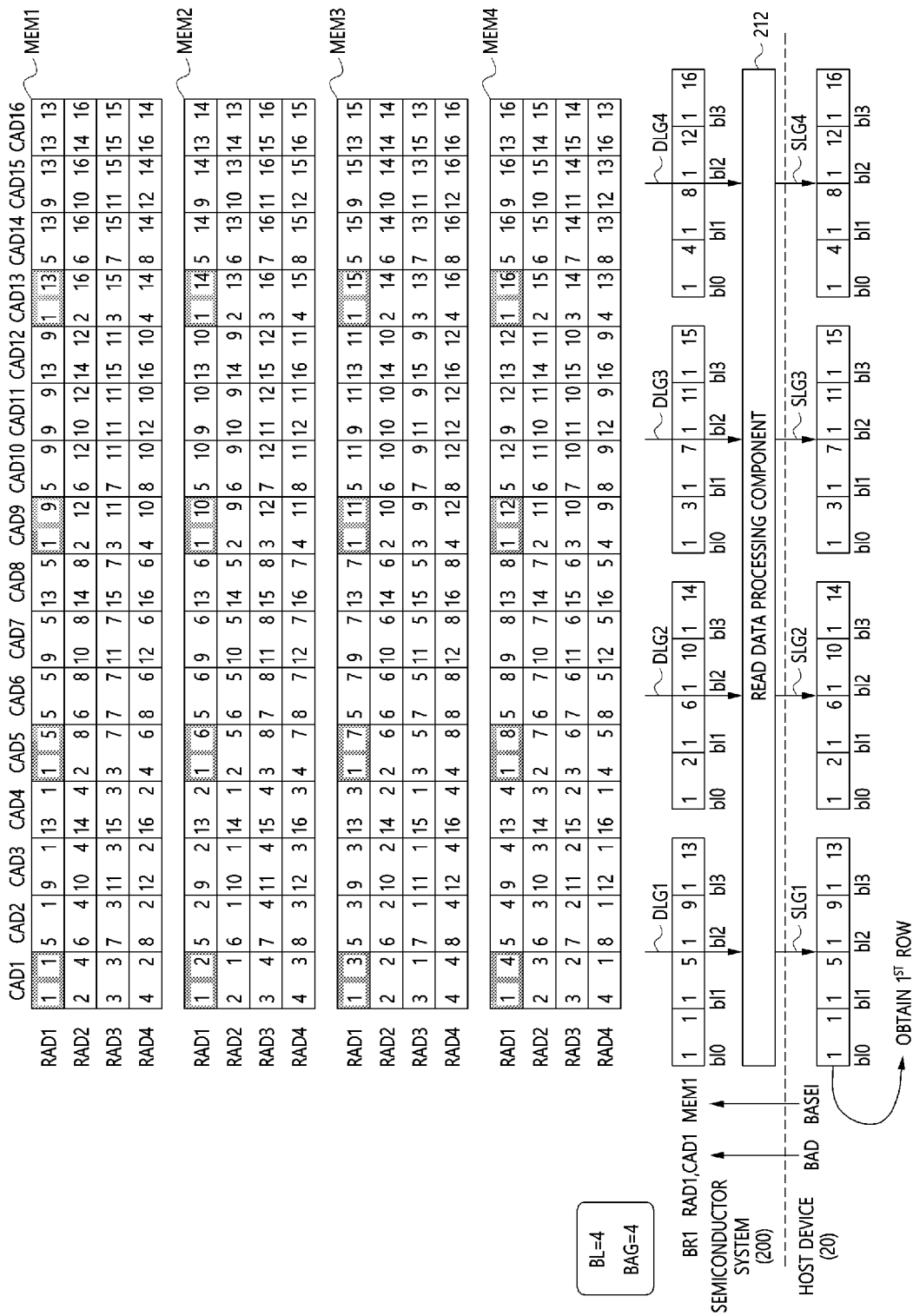
FIGS. 23 and 24 are diagrams illustrating a process of obtaining rows of the matrix from the semiconductor system of FIG. 9 according to an embodiment of the present disclosure.
Figure 24:
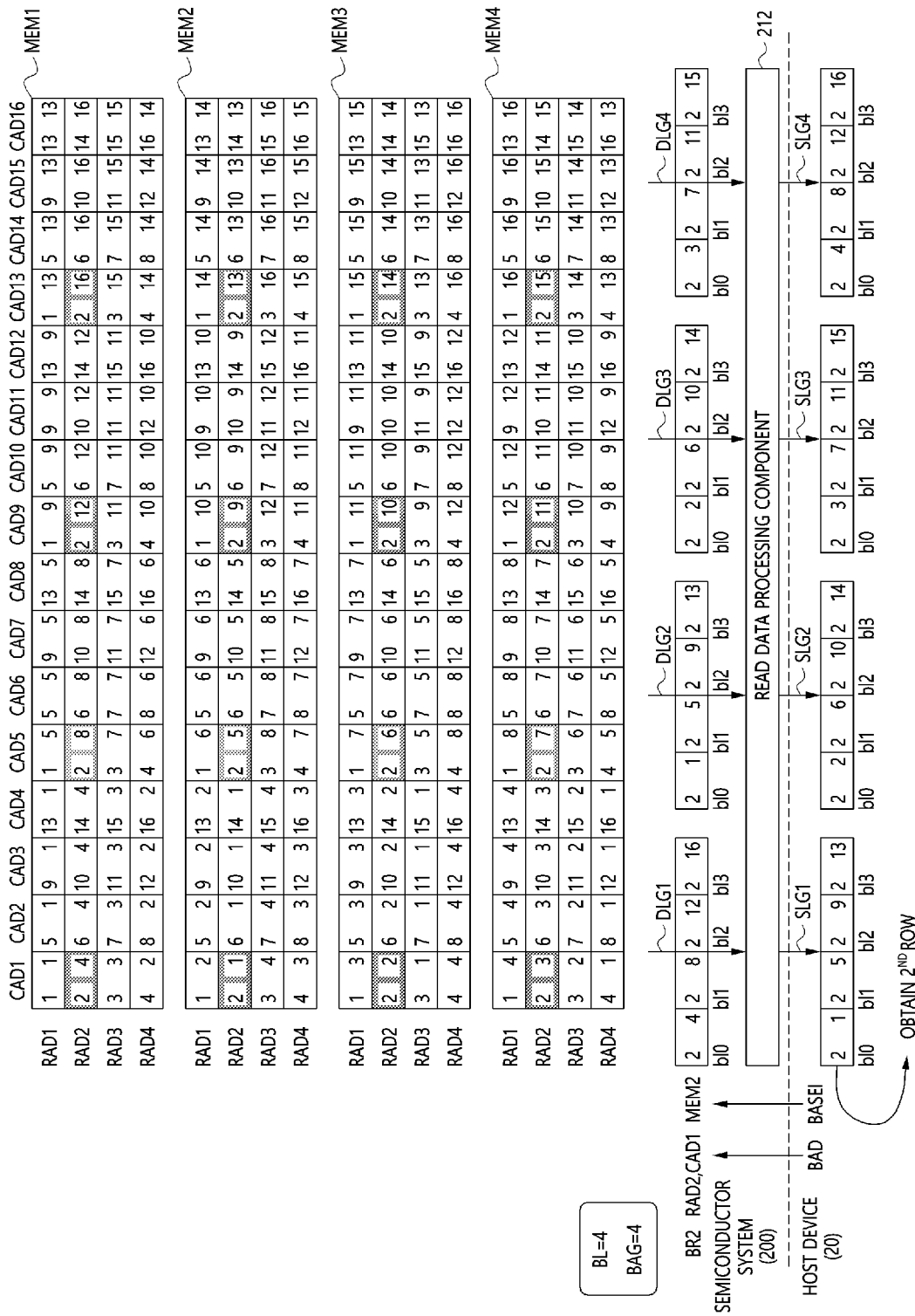

FIGS. 23 and 24 are diagrams illustrating a process of obtaining rows of the matrix from the semiconductor system 200 of FIG. 9 according to an embodiment of the present disclosure. Referring to FIGS. 23 and 24, the matrix is stored in the semiconductor system 200 in the way described with reference to FIG. 22. Each of the first to fourth memory devices MEM1 to MEM4 may support the burst address gap BAG.

When the original matrix is required, the host device 20 may perform a row read operation.

The host device 20 may obtain each row of the matrix from the semiconductor system 200 through the burst read operations for the burst length BL and the burst address gap BAG of a value four (4).

When reading each row of the matrix from the semiconductor system 200, the host device 20 may utilize the same row address and the same start column address CAD1 as utilized when storing the row into the semiconductor system 200.

When reading each row of the matrix from the semiconductor system 200, the host device 20 may provide the semiconductor system 200 with the same base device information BASEI as provided to the semiconductor system 200 when storing the row into the semiconductor system 200.

Referring to FIG. 23, the host device 20 may read the first row of the matrix from the semiconductor system 200 through the first burst read operation BR1 of the burst length BL and the burst address gap BAG of a value four (4). For the first burst read operation BR1, the host device 20 may provide the memory controller 210 with the base address BAD including the first row address RAD1 and the start column address CAD1. Also, the host device 20 may provide the memory controller 210 with the base device information BASEI indicating the first memory device MEM1 as the base device BASE.

Under the control of the memory controller 210, the first to fourth memory devices MEM1 to MEM4 may perform, in a parallel way, the first burst read operations BR1 of the burst length BL and the burst address gap BAG of a value four (4) on the first row address RAD1.

Since the base device BASE is the first memory device MEM1, the read data processing component 212 may transfer the elements from the first to fourth device line groups DLG1 to DLG4 to the first to fourth system line groups SLG1 to SLG4, respectively, through the line mapping operation. Therefore, the host device 20 may obtain the first row of the matrix.

Referring to FIG. 24, the host device 20 may read the second row of the matrix from the semiconductor system 200 through the second burst read operation BR2 of the burst length BL and the burst address gap BAG of a value four (4). For the second burst read operation BR2, the host device 20 may provide the memory controller 210 with the base address BAD including the second row address RAD2 and the start column address CAD1. Also, the host device 20 may provide the memory controller 210 with the base device information BASEI indicating the second memory device MEM2 as the base device BASE.

Under the control of the memory controller 210, the first to fourth memory devices MEM1 to MEM4 may perform, in a parallel way, the second burst read operations BR2 of the burst length BL and the burst address gap BAG of a value four (4) on the second row address RAD2.

Since the base device BASE is the second memory device MEM2, the read data processing component 212 may transfer the elements from the first to fourth device line groups DLG1 to DLG4 to the fourth, first, second and third system line groups SLG4, SLG1, SLG2 and SLG3, respectively, through the line mapping operation. Therefore, the host device 20 may obtain the second row of the matrix.

In the same way as described above, the host device 20 may obtain remaining rows of the matrix to obtain the original matrix.

Figure 25:
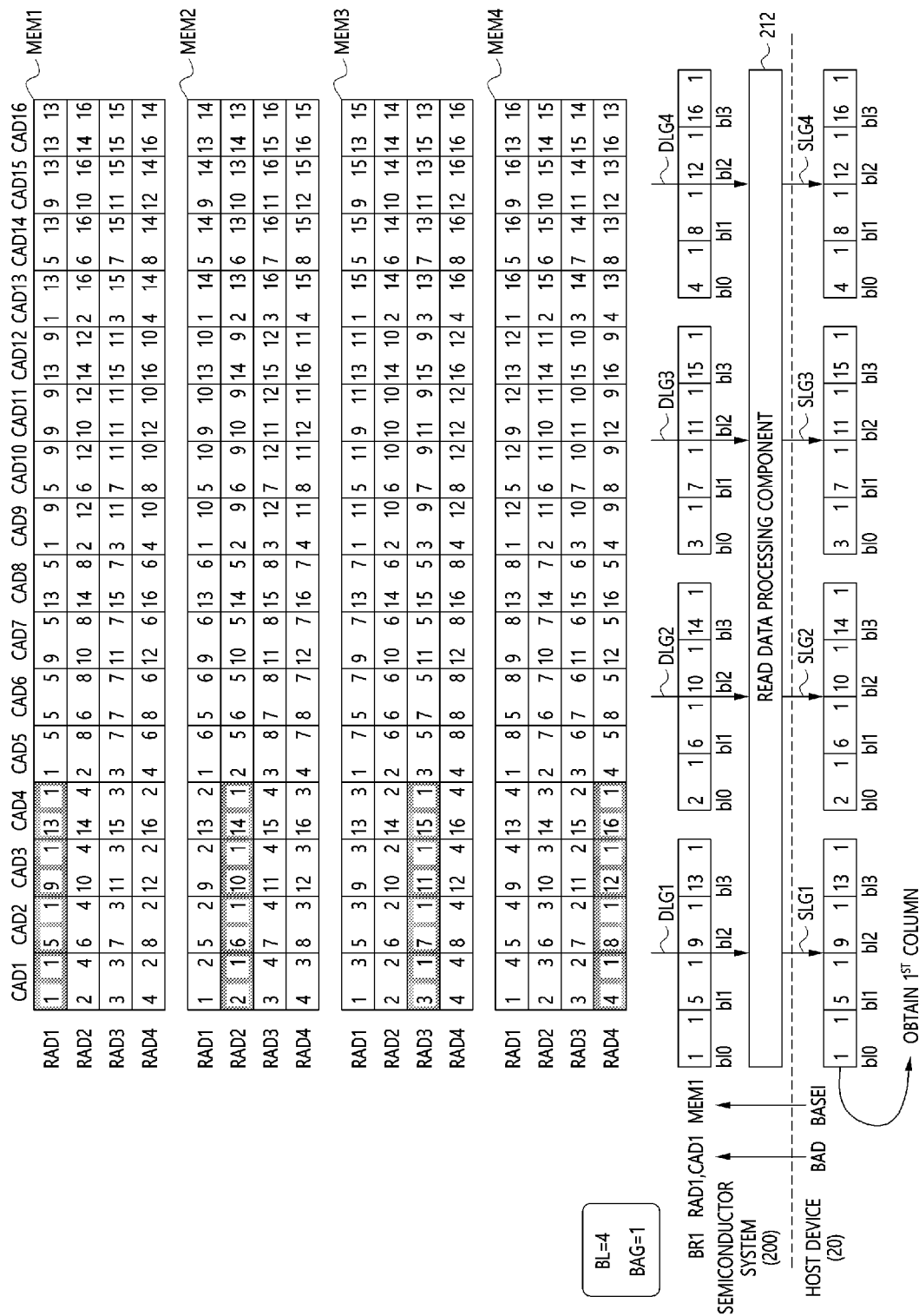
FIGS. 25 and 26 are diagrams illustrating a process of obtaining columns of the matrix from the semiconductor system of FIG. 9 according to an embodiment of the present disclosure.
Figure 26:
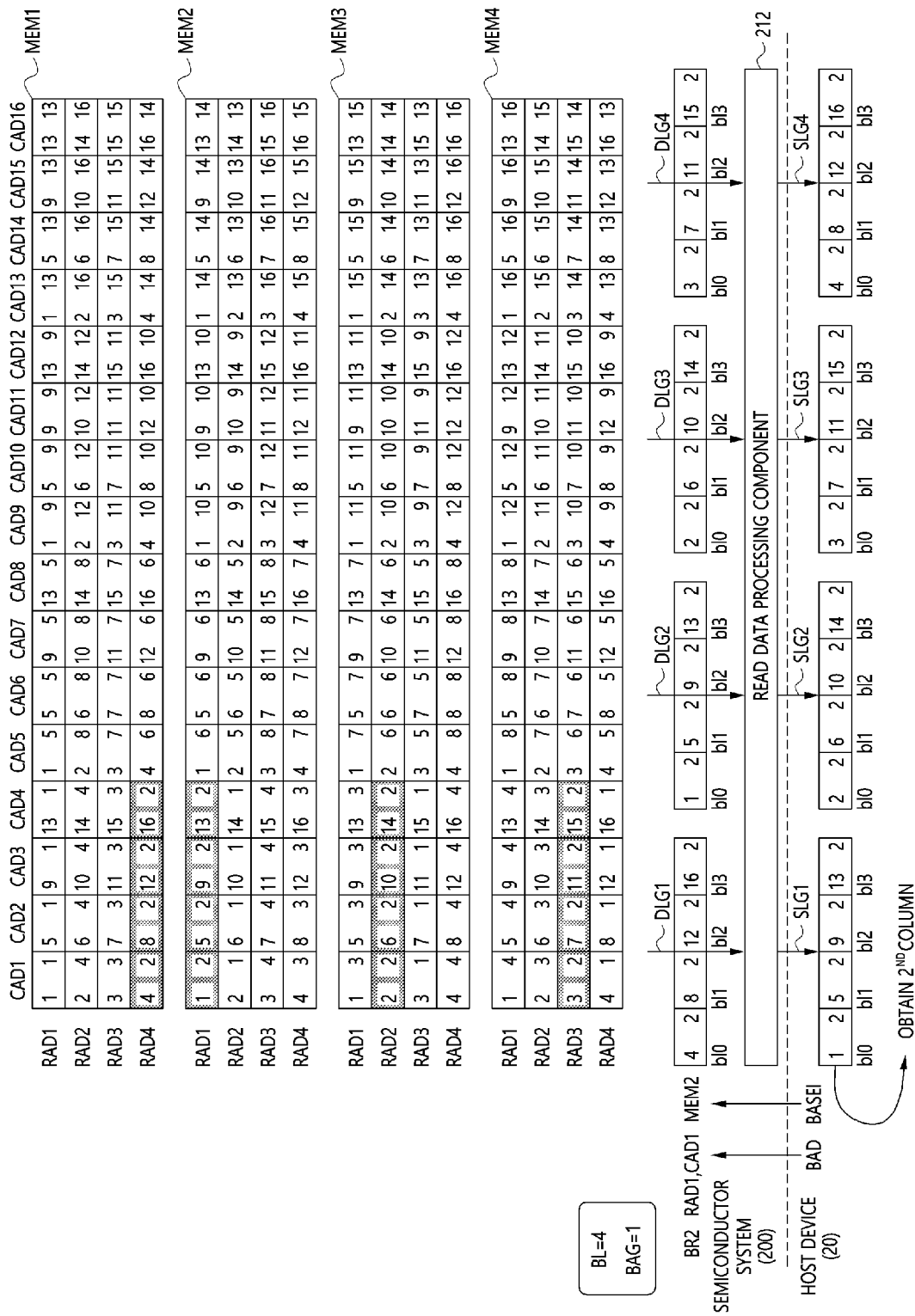

FIGS. 25 and 26 are diagrams illustrating a process of obtaining columns of the matrix from the semiconductor system 200 of FIG. 9 according to an embodiment of the present disclosure. Referring to FIGS. 25 and 26, the matrix is stored in the semiconductor system 200 in the way described with reference to FIG. 22. Each of the first to fourth memory devices MEM1 to MEM4 may support the burst address gap BAG.

When the transposed matrix is required, the host device 20 may perform a column read operation.

Through the burst read operations of the burst length BL of a value four (4) and the burst address gap BAG of a value one (1), the host device 20 may read each column set of the matrix from the semiconductor system 200.

Whenever reading each column of the matrix from the semiconductor system 200, the host device 20 may provide the memory controller 210 with the first row address RAD1.

The host device 20 may provide the memory controller 210 with the start column address CAD1, which is utilized when storing the matrix into the semiconductor system 200, whenever reading each of columns, a number of which corresponds to the burst length BL (i.e., four number of first to fourth columns in this case), from the semiconductor system 200. The host device 20 may provide the memory controller 210 with the column address CAD5, which increases by an amount of four (4) from the initial start column address CAD1, whenever reading each of four number of fifth to eighth columns that are subsequent to the four number of first to fourth columns. The host device 20 may provide the memory controller 210 with the column address CAD8, which increases by an amount of eight (8) from the initial start column address CAD1, whenever reading each of four number of ninth to twelfth columns that are subsequent to the four number of fifth to eighth columns. The host device 20 may provide the memory controller 210 with the column address CAD13, which increases by an amount of twelve (12) from the initial start column address CAD1, whenever reading each of four number of thirteenth to sixteenth columns that are subsequent to the four number of ninth to twelfth columns.

Whenever reading each column of the matrix from the semiconductor system 200, the host device 20 may determine the base device BASE and provide the memory controller 210 with the base device information BASEI. Whenever sequentially reading the columns starting from a first column of the matrix, the host device 20 may determine, as the base device BASE, the first to fourth memory devices MEM1 to MEM4 sequentially starting from the first memory device MEM1 according to the device order.

During the column read operation, the host device 20 may control the address conversion component 213 of the memory controller 210 to operate.

Referring to FIG. 25, the host device 20 may read, from the semiconductor system 200, the first column of the matrix through the first burst read operation BR1 of the burst length BL of a value four (4) and the burst address gap BAG of a value one (1). For the first burst read operation BR1 of the burst length BL of a value four (4) and the burst address gap BAG of a value one (1), the host device 20 may provide the memory controller 210 with the base address BAD including the first row address RAD1 and the start column address CAD1. Also, the host device 20 may provide the memory controller 210 with the base device information BASEI indicating the first memory device MEM1 as the base device BASE.

During the column read operation, the address conversion component 213 may operate under the control of the host device 20, which is different from the row read operation. Since the base device BASE is the first memory device MEM1, the address conversion component 213 may generate the first device address DAD1, which is to be provided to the first memory device MEM1, by converting the base address BAD provided from the host device 20. Also, the address conversion component 213 may generate addresses that increase by respective amounts of 1, 2 and 3 from the row address of the base address BAD, i.e., from the first row address RAD1, as the second to fourth device addresses DAD2 to DAD4, which are to be provided respectively to the second to fourth memory devices MEM2 to MEM4.

Therefore, the first memory device MEM1 may perform the first burst read operation BR1 of the burst length BL of a value four (4) and the burst address gap BAG of a value one (1) on the first row address RAD1, the second memory device MEM2 may perform the first burst read operation BR1 of the burst length BL of a value four (4) and the burst address gap BAG of a value one (1) on the second row address RAD2, the third memory device MEM3 may perform the first burst read operation BR1 of the burst length BL of a value four (4) and the burst address gap BAG of a value one (1) on the third row address RAD3 and the fourth memory device MEM4 may perform the first burst read operation BR1 of the burst length BL of a value four (4) and the burst address gap BAG of a value one (1) on the fourth row address RAD4. The first to fourth memory devices MEM1 to MEM4 may perform the first burst read operations BR1 in parallel.

Since the base device BASE is the first memory device MEM1, the read data processing component 212 may transfer the elements from the first to fourth device line groups DLG1 to DLG4 to the first to fourth system line groups SLG1 to SLG4, respectively, through the line mapping operation. Therefore, the host device 20 may obtain the first column of the matrix.

Referring to FIG. 26, the host device 20 may read, from the semiconductor system 200, the second column of the matrix through the second burst read operation BR2 of the burst length BL of a value four (4) and the burst address gap BAG of a value one (1). For the second burst read operation BR2 of the burst length BL of a value four (4) and the burst address gap BAG of a value one (1), the host device 20 may provide the memory controller 210 with the base address BAD including the first row address RAD1 and the start column address CAD1. Also, the host device 20 may provide the memory controller 210 with the base device information BASEI indicating the second memory device MEM2 as the base device BASE.

During the column read operation, the address conversion component 213 may operate under the control of the host device 20, which is different from the row read operation. Since the base device BASE is the second memory device MEM2, the address conversion component 213 may generate the second device address DAD2, which to be provided to the second memory device MEM2, by converting the base address BAD provided from the host device 20. Also, the address conversion component 213 may generate addresses that increase by respective amounts of 1, 2 and 3 from the row address of the base address BAD, i.e., from the first row address RAD1, as the third, fourth and first device addresses DAD3, DAD4 and DAD1, which are to be provided respectively to the third, fourth and first memory devices MEM3, MEM4, MEM1.

Therefore, the first memory device MEM1 may perform the second burst read operation BR2 of the burst length BL of a value four (4) and the burst address gap BAG of a value one (1) on the fourth row address RAD4, the second memory device MEM2 may perform the second burst read operation BR2 of the burst length BL of a value four (4) and the burst address gap BAG of a value one (1) on the first row address RAD1, the third memory device MEM3 may perform the second burst read operation BR2 of the burst length BL of a value four (4) and the burst address gap BAG of a value one (1) on the second row address RAD2 and the fourth memory device MEM4 may perform the second burst read operation BR2 of the burst length BL of a value four (4) and the burst address gap BAG of a value one (1) on the third row address RAD3. The first to fourth memory devices MEM1 to MEM4 may perform the second burst read operations BR2 in parallel.

Since the base device BASE is the second memory device MEM2, the read data processing component 212 may transfer the elements from the first to fourth device line groups DLG1 to DLG4 to the fourth, first, second and third system line groups SLG4, SLG1, SLG2 and SLG3, respectively, through the line mapping operation. Therefore, the host device 20 may obtain the second column of the matrix.

To sum up, the semiconductor system 200 may be designed to include a plurality of memory devices each having a device input/output bit width which is the same as the precision degree of the matrix, and each configured to support the burst address gap BAG, and designed to store therein the matrix in the process described above, such that the row read operation and the column read operation may be efficiently performed.

According to an embodiment, the memory device, the semiconductor system and the data processing system may efficiently store the matrix and may read, at a low cost, the original matrix or the transposed matrix to utilize them.

While certain embodiments have been described above, it will be understood to those skilled in the art that the embodiments described are by way of example only. Accordingly, the memory device, the semiconductor system and the data processing system should not be limited based on the described embodiments. Rather, the memory device, the semiconductor system and the data processing system described herein should only be limited in light of the claims that follow when taken in conjunction with the above description and accompanying drawings. Furthermore, the embodiments may be combined to form additional embodiments.

What is claimed is:

1. A memory device comprising:
   a memory cell array including a plurality of memory regions each identified by a row address and a column address; and
   a peripheral circuit configured to access the memory cell array by performing, based on an address, a burst length and a burst address gap provided from a memory controller, a burst operation supporting a variable burst address gap,
   wherein the burst address gap is a numerical difference between adjacent column addresses, on which the burst operation is to be performed.

2. The memory device of claim 1,
   wherein the address includes a row address and a start column address, and
   wherein the column addresses start from the start column address and have a numerical difference from each other by an amount of the burst address gap and a number of the column addresses corresponding to the burst length.

3. The memory device of claim 1, wherein the peripheral circuit is configured to perform a burst write operation of the burst address gap having the same value as the burst length to store a (i, j)th element of a matrix into a memory region of an address, which is determined by equation 1:

$$\text{Address}=\text{Baddr}+(i-i\%(bl+1))*\text{Mcol}+i\%(bl+1)-1+(j-1)*bl, \quad \text{[Equation 1]}$$

where "Baddr" represents an address of a memory region in which a (1, 1)th element of the matrix is stored, "Mcol" represents a number of columns of the matrix, "%" represents a modulo operation and "bl" represents the burst length.

4. A semiconductor system comprising:
   a memory device including:
     a memory cell array including a plurality of memory regions; and
     a peripheral circuit configured to access the memory cell array by performing a burst operation supporting a variable burst address gap; and
   a memory controller configured to provide the memory device with an address, a burst length and a burst address gap in order to control the burst operation,
   wherein the burst address gap is a numerical difference between adjacent column addresses, on which the burst operation is to be performed.

5. The semiconductor system of claim 4,
   wherein the address includes a row address and a start column address, and
   wherein the column addresses start from the start column address and have a numerical difference from each other by an amount of the burst address gap and a number of the column addresses corresponding to the burst length.

6. The semiconductor system of claim 4, wherein the memory controller is configured to control the memory device to perform a burst write operation of the burst address gap having the same value as the burst length to store a matrix into the memory device.

7. The semiconductor system of claim 6, wherein the memory controller is configured to store, when a precision degree of the matrix is the same as a device input/output bit width of the memory device, a (i, j)th element of the matrix into a memory region of an address, which is determined by equation 1:

$$\text{Address}=\text{Baddr}+(i-i\%(bl+1))*\text{Mcol}+i\%(bl+1)-1+(j-1)*bl, \quad \text{[Equation 1]}$$

where "Baddr" represents an address of a memory region in which a (1, 1)th element of the matrix is stored, "Mcol" represents a number of columns of the matrix, "%" represents a modulo operation and "bl" represents the burst length.

8. The semiconductor system of claim 7, wherein the memory controller is configured to provide, in order to store each row of the matrix into the memory device, the memory device with:
   consecutive row addresses as row addresses for the burst write operation, the consecutive row addresses starting from a row address of an initial element of the row, which is determined by equation 1, and
   a column address of the initial element of the row, which is determined by equation 1, as a start column address for the burst write operation.

9. The semiconductor system of claim 7, wherein the memory controller is configured to control the memory device to perform a burst read operation of the burst address gap having the same value as the burst length to read each row of the matrix from the memory device.

10. The semiconductor system of claim 9, wherein the memory controller is configured to provide, in order to read the row of the matrix from the memory device, the memory device with:
    consecutive row addresses as row addresses for the burst read operation, the consecutive row addresses starting from a row address of an initial element of the row, which is determined by equation 1, and
    a column address of the initial element of the row, which is determined by equation 1, as a start column address for the burst read operation.

11. The semiconductor system of claim 7, wherein the memory controller is configured to control the memory device to perform a burst read operation of the burst address gap of a value one (1) to read each column of the matrix from the memory device.

12. The semiconductor system of claim 11, wherein the memory controller is configured to provide, in order to read the column of the matrix from the memory device, the memory device with:
    row addresses for the burst read operation, the row addresses starting from a row address of an initial element of the column, which is determined by equation 1, and having a numerical difference from each other by an amount of the burst length, and a column address of the initial element of the column, which is determined by equation 1, as a start column address for the burst read operation.

13. A semiconductor system comprising:
a plurality of memory devices; and
a memory controller coupled to the plurality of memory devices respectively through a plurality of device line groups and coupled to a host device through system lines,
wherein the memory controller includes a write data processing component configured to:
receive, from the host device, base device information indicating a base device among the plurality of memory devices,
map, based on the base device information, the plurality of device line groups and a plurality of system line groups, which are divided from the system lines, and
transfer data, which are provided from the host device through the plurality of system line groups, to the plurality of device line groups mapped to the plurality of system line groups, respectively.

14. The semiconductor system of claim 13, wherein the write data processing component is configured to map the plurality of system line groups sequentially to the plurality of device line groups according to a device order starting from a device line group corresponding to the base device.

15. The semiconductor system of claim 13, wherein the memory controller further includes a read data processing component configured to:
map, based on the base device information, the plurality of device line groups and the plurality of system line groups, and
transfer data, which are provided from the plurality of memory devices through the plurality of device line groups, to the plurality of system line groups mapped to the plurality of device line groups, respectively.

16. The semiconductor system of claim 15, wherein the read data processing component is configured to map the plurality of system line groups sequentially to the plurality of device line groups according to a device order starting from a device line group corresponding to the base device.

17. The semiconductor system of claim 13, wherein the memory controller further includes an address conversion component configured to:
receive a base address from the host device, and
convert, based on the base device information, the base address into a plurality of device addresses to be provided respectively to the plurality of memory devices.

18. The semiconductor system of claim 17,
wherein a device address of the base device is the base address, and
wherein device addresses of remaining memory devices among the plurality of memory devices respectively include consecutive row addresses, which respectively increase by an amount of one (1) from a row address of the base address, and each include a column address of the base address.

19. A data processing system comprising:
a semiconductor system including:
a plurality of memory devices; and
a memory controller coupled to the plurality of memory devices respectively through a plurality of device line groups; and
a host device coupled to the memory controller through system lines and configured to provide the memory controller with base device information indicating a base device among the plurality of memory devices,
wherein the host device is configured to transmit, in order to store a matrix into the semiconductor system, a plurality of elements of the matrix to a plurality of system line groups, which are divided from the system lines, in a parallel way,
wherein the memory controller is configured to map, based on the base device information, the plurality of system line groups to the plurality of device line groups to store the matrix into the plurality of memory devices, and
wherein a precision degree of the matrix is the same as a bit width of each of the plurality of device line groups.

20. The data processing system of claim 19, wherein the host device is configured to store a (i, j)th element of the matrix into a memory region of an address, which is determined according to equation 3, within a memory device, which is determined according to equation 2:

$$\text{Number indicating a memory device to store therein a } (i,j)\text{th element of a matrix} = [(i-1)\text{Mcol}+j-1+\text{RoundDown}(((i-1)*\text{Mcol}+j-1)/(bl*\text{ChipNum}))]\% \text{ ChipNum}, \quad \text{[Equation 2]}$$

$$\text{Address} = \text{Baddr} + (i-1)*\text{RoundUp}(\text{Mcol}/bl) + \text{RoundDown}((j-1-(j-1)\%bl)/bl), \quad \text{[Equation 3]}$$

where "Baddr" represents an address of a memory region in which a (1, 1)th element of the matrix is stored, "Mcol" represents a number of columns of the matrix, "bl" represents a burst length, "%" represents a modulo operation, "RoundUp( )" represents a round-up function, "RoundDown( )" represents a round-down function and "ChipNum" represents a number of the memory devices.

21. The data processing system of claim 20, wherein the host device is, in order to store each row of the matrix into the semiconductor system, configured to:
determine, as the base device, a memory device determined according to equation 2 to store therein an initial element of the row,
provide the semiconductor system with a row address of the initial element of the row determined according to equation 3 as a row address for a burst write operation, and
provide the semiconductor system with a column address of the initial element of the row determined according to equation 3 as a start column address for the burst write operation.

22. The data processing system of claim 20, wherein the host device is, in order to read each row of the matrix from the semiconductor system, configured to:
provide the semiconductor system with a row address of an initial element of the row determined according to equation 3 as a row address for a burst read operation, and
provide the semiconductor system with a column address of the initial element of the row determined according to equation 3 as a start column address for the burst read operation.

23. The data processing system of claim 20, wherein the host device is, in order to read each column set including a plurality of columns of the matrix from the semiconductor system, configured to:
provide the semiconductor system with row addresses, which start from a row address of an initial element of the column set determined according to equation 3 and have a numerical difference between adjacent row addresses by a number of the plurality of memory devices, as row addresses for a burst read operation, and provide the semiconductor system with a column address of the initial element of the column set determined according to equation 3 as a start column address for the burst read operation.

24. The data processing system of claim 19, wherein the memory controller includes a write data processing component configured to:

map, based on the base device information, the plurality of device line groups and the plurality of system line groups, and transfer data, which are provided from the host device through the plurality of system line groups, to the plurality of device line groups mapped to the plurality of system line groups, respectively.

25. The data processing system of claim 19, wherein the memory controller includes a read data processing component configured to:

map, based on the base device information, the plurality of device line groups and the plurality of system line groups, and transfer data, which are provided from the plurality of memory devices through the plurality of device line groups, to the plurality of system line groups mapped to the plurality of device line groups, respectively.

26. The data processing system of claim 19, wherein the memory controller includes an address conversion component configured to:

receive a base address from the host device, and convert, based on the base device information, the base address into a plurality of device addresses to be provided respectively to the plurality of memory devices.

27. The data processing system of claim 26, wherein a device address of the base device is the base address, and wherein device addresses of remaining memory devices among the plurality of memory devices respectively include consecutive row addresses, which respectively increase by an amount of one (1) from a row address of the base address, and each include a column address of the base address.

28. The data processing system of claim 19, wherein each of the plurality of memory devices is configured to perform, based on an address, a burst length and a burst address gap provided from the memory controller, a burst operation supporting a variable burst address gap, and wherein the burst address gap is a numerical difference between adjacent column addresses, on which the burst operation is to be performed.

29. The data processing system of claim 28, wherein the address includes a row address and a start column address, and wherein the column addresses start from the start column address and have a numerical difference from each other by an amount of the burst address gap and a number of the column addresses corresponding to the burst length.

30. The data processing system of claim 28, wherein the host device is configured to control the semiconductor system to perform a burst write operation of the burst address gap having the same value as the burst length to store a matrix into the semiconductor system.

31. The data processing system of claim 30, wherein the host device is configured to control the semiconductor system to perform a burst read operation of the burst address gap having the same value as the burst length to read each row of the matrix from the semiconductor system.

32. The data processing system of claim 30, wherein the host device is configured to control the semiconductor system to perform a burst read operation of the burst address gap of a value one (1) to read each column of the matrix from the semiconductor system.

\* \* \* \* \*